(12) United States Patent
Belfiore et al.

(10) Patent No.: US 10,985,871 B2
(45) Date of Patent: Apr. 20, 2021

(54) METHOD TO GENERATE ORDERED SEQUENCE FOR POLAR CODES

(71) Applicant: Huawei Technologies Co., Ltd., Shenzhen (CN)

(72) Inventors: Jean-Claude Belfiore, Paris (FR); Yiqun Ge, Ottawa (CA); Gaoning He, Boulogne-Billancourt (FR); Ran Zhang, Kanata (CA); Ingmar Land, Boulogne-Billancourt (FR); Wuxian Shi, Kanata (CA); Wen Tong, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 75 days.

(21) Appl. No.: 15/875,766

(22) Filed: Jan. 19, 2018

(65) Prior Publication Data
US 2018/0248655 A1  Aug. 30, 2018

Related U.S. Application Data

(60) Provisional application No. 62/500,834, filed on May 3, 2017, provisional application No. 62/463,289, filed on Feb. 24, 2017.

(51) Int. Cl.
*H04L 1/00* (2006.01)
*H03M 13/00* (2006.01)
(Continued)

(52) U.S. Cl.
CPC ........ *H04L 1/0058* (2013.01); *H03M 13/033* (2013.01); *H03M 13/13* (2013.01);
(Continued)

(58) Field of Classification Search
CPC .................................................... H03M 13/13
See application file for complete search history.

(56) References Cited

U.S. PATENT DOCUMENTS 9,503,126 B2   11/2016 Vardy et al.
2014/0108748 A1* 4/2014 Lee .................... H03M 13/1111
                                                         711/154
(Continued)

FOREIGN PATENT DOCUMENTS

CN    101325474 B    5/2012
CN    103684477 A    3/2014
(Continued)

OTHER PUBLICATIONS

C. Schürch, "A partial order for the synthesized channels of a polar code," 2016 IEEE International Symposium on Information Theory (ISIT), Barcelona, 2016.*
(Continued)

*Primary Examiner* — Steve N Nguyen
(74) *Attorney, Agent, or Firm* — Slater Matsil, LLP

(57) ABSTRACT

A number K of N sub-channels that are defined by a code and that have associated reliabilities for input bits at N input bit positions, are to be selected to carry bits that are to be encoded. A localization area that includes multiple sub-channels and is located below fewer than K of the N sub-channels in a partial order of the N sub-channels is determined based on one or more coding parameters. The fewer than K sub-channels of the N sub-channels above the localization area in the partial order are selected, and a number of sub-channels from those in the localization area are also selected. The selected fewer than K sub-channels and the number of sub-channels selected from those in the localization area together include K sub-channels to carry the bits that are to be encoded.

26 Claims, 19 Drawing Sheets

(51) Int. Cl.
*H03M 13/13* (2006.01)
*H03M 13/03* (2006.01)

(52) U.S. Cl.
CPC ..... *H03M 13/618* (2013.01); *H03M 13/6362* (2013.01); *H04L 1/0041* (2013.01); *H04L 1/0045* (2013.01); *H04L 1/0057* (2013.01); *H04L 1/0068* (2013.01)

(56) References Cited

U.S. PATENT DOCUMENTS

| | | | |
|---|---|---|---|
| 2014/0169388 | A1 | 6/2014 | Jeong et al. |
| 2015/0194987 | A1 | 7/2015 | Li et al. |
| 2016/0269050 | A1 | 9/2016 | Shen et al. |
| 2017/0149531 | A1* | 5/2017 | Raza ................ G06F 11/10 |
| 2017/0338996 | A1* | 11/2017 | Sankar ............... H04L 27/20 |
| 2019/0052418 | A1* | 2/2019 | Li ..................... H04L 1/1819 |

FOREIGN PATENT DOCUMENTS

| | | |
|---|---|---|
| CN | 105049061 A | 11/2015 |
| CN | 105099622 A | 11/2015 |
| CN | 105933010 A | 9/2016 |
| CN | 105075163 B | 2/2019 |
| CN | 106416083 B | 1/2020 |
| KR | 20160100225 A | 8/2016 |
| WO | 2016112285 A2 | 7/2016 |

OTHER PUBLICATIONS

M. Alsan, "A novel partial order for the information sets of polar codes over B-DMCs," 2014 IEEE International Symposium on Information Theory, Honolulu, HI, 2014.*

Arikan, E., "Channel Polarization: A Method for Constructing Capacity-Achieving Codes for Symmetric Binary-Input Memoryless Channels," IEEE Transactions on Information Theory, Jul. 2009, 23 pages, vol. 55, No. 7.

Mondelli, M., "Construction of Polar Codes with Sublinear Complexity," Jul. 13, 2017, 9 pages, arXiv:1612.05295v4 [cs.IT].

Mori, R. et al., "Performance of Polar Codes with the Construction using Density Evolution," IEEE Communications Letters, Jul. 2009, 3 pages, vol. 13, No. 7.

3GPP TSG RAN WG1, "Summary of polar code design for control channels," R1-1700088, Ad-Hoc Meeting, 16th—Jan. 20, 2017, 10 pages.

Trifonov, P., "Efficient Design and Decoding of Polar Codes," IEEE Transactions on Communications, Nov. 2012, 7 pages, vol. 60, No. 11.

Mondelli, M., et al., "Construction of Polar Codes with Sublinear Complexity", arXiv:1612.05295v3 [cs.IT]Jan. 31, 2017, 10 Pages.

Li, B., et al., "A RM-Polar Codes", arXiv: 1407.5483v1, [cs. IT], Jul. 21, 2014, 2 Pages.

* cited by examiner

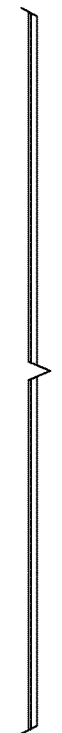
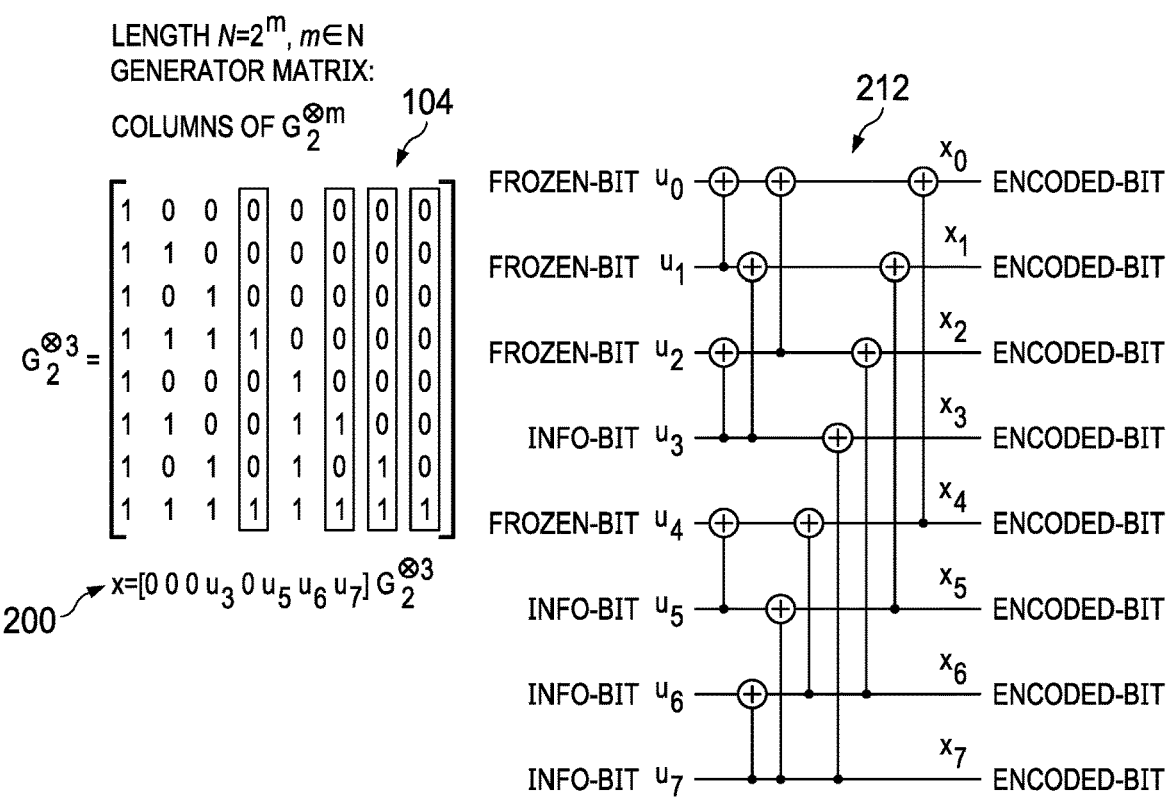
FIG. 1
FIG. 2

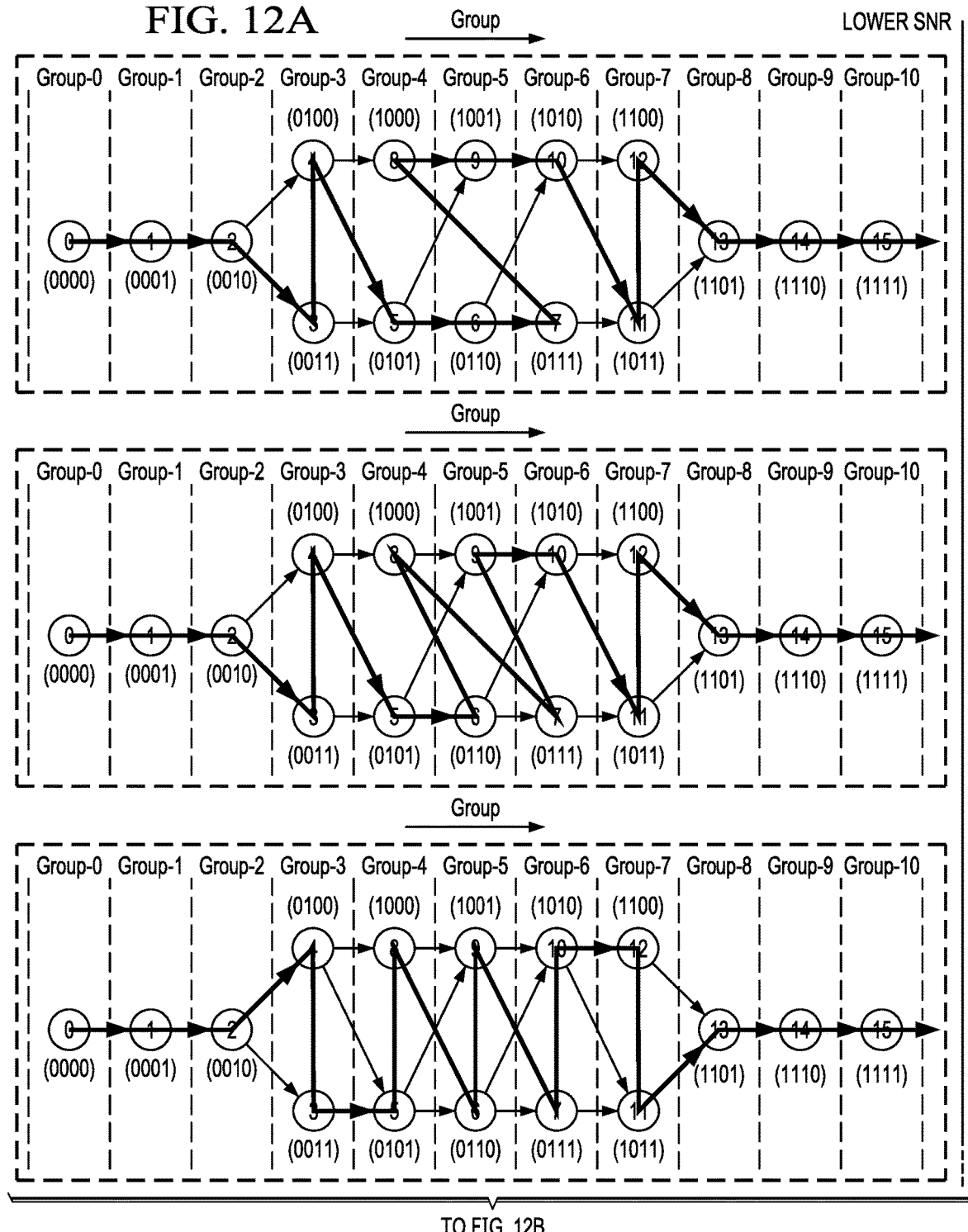
TO FIG. 12B

METHOD TO GENERATE ORDERED SEQUENCE FOR POLAR CODES

CROSS-REFERENCE TO RELATED APPLICATIONS

This application claims benefit to Provisional Application No. 62/463,289, filed on Feb. 24, 2017, and to Provisional Application No. 62/500,834, filed on May 3, 2017, the disclosures of which are hereby incorporated by reference in their entireties.

TECHNICAL FIELD

The present disclosure relates generally to communications and, in particular, to selecting coding sub-channels.

BACKGROUND

Polar codes are proposed as channel codes for use in future wireless communications, and have been selected for uplink and downlink enhanced mobile broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation List (SCL) decoding is one option for decoding polar coded information.

Based on channel polarization, Arikan designed a channel code that is proven to reach channel capacity. Polarization refers to a coding property that, as code length increases to infinity, bit-channels polarize and their capacities approach either zero (completely noisy channel) or one (completely perfect channel). The fraction of perfect bit-channels is equal to the capacity of a channel.

SUMMARY

In accordance with an embodiment of the present disclosure, a method comprises determining, from N sub-channels that are defined by a code and that have associated reliabilities for input bits at N input bit positions, a number K of the sub-channels to carry bits that are to be encoded; determining, based on one or more coding parameters, a localization area that includes a plurality of the N sub-channels and is located below fewer than K of the N sub-channels in a partial order of the N sub-channels; selecting the fewer than K sub-channels of the N sub-channels above the localization area in the partial order; and selecting a number of sub-channels from the plurality of sub-channels in the localization area, wherein the selected fewer than K sub-channels and the number of sub-channels selected from the plurality of sub-channels in the localization area comprise K sub-channels to carry the bits that are to be encoded.

In the previous embodiment, the one or more coding parameters might comprise any one or more of: code rate, mother code block length N, code block length M, information block length K, rate matching scheme, and SNR. In any of the previous embodiments, the partial order might comprise a plurality of groups of sub-channels comprising respective subsets of the N sub-channels, and the method might further comprise determining a group of the plurality of groups to which a Kth sub-channel from a highest end of the partial order belongs; and determining the localization area as a number of groups adjacent to and including the group to which the Kth sub-channel from the highest end of the partial order belongs. In any of the previous embodiments, determining the localization area might comprise determining a first number of adjacent groups in the partial order above the group to which the Kth sub-channel from the highest end of the partial order belongs and a second number of adjacent groups in the partial order below the group to which the Kth sub-channel from the highest end of the partial order belongs. In any of the previous embodiments, determining the first number of adjacent groups and the second number of adjacent groups might comprise:

if Group_Sum[$i$]−$K$<$K$−Group_Sum[$i$+1], then
$\Delta L1$>=$\Delta L2$;

otherwise, $\Delta L1$<=$\Delta L2$, where Group_Sum[$i$] represents a total number of sub-channels in group $i$ to group $L-1$ ($0 \leq i \leq L-1$), group $i$ is the group to which the Kth sub-channel from the highest end of the partial order belongs, L is the total number of groups including all of the N sub-channels, $\Delta L1$ is the first number of adjacent groups, and $\Delta L2$ is the second number of adjacent groups. In any of the previous embodiments, determining the localization area might comprise determining the localization area as a number of sub-channels adjacent to and including a Kth sub-channel from a highest end of the partial order. In any of the previous embodiments, determining the localization area might comprise determining a first number of adjacent nodes in the partial order above the Kth sub-channel from the highest end of the partial order and a second number of adjacent nodes in the partial order below the Kth sub-channel from the highest end of the partial order. In any of the previous embodiments, the partial order might comprise a plurality of groups of sub-channels comprising respective subsets of the N sub-channels, and the method might further comprise determining a group of the plurality of groups to which the Kth sub-channel from the highest end of the partial order belongs; and determining a total number of sub-channels in the localization area based on numbers of sub-channels in groups adjacent to the group to which the Kth sub-channel from the highest end of the partial order belongs. In any of the previous embodiments, determining the group to which the Kth sub-channel from the highest end of the partial order belongs might comprise determining an ith group of the plurality of groups, for which Group_Sum[$i$+1]<$K$<=Group_Sum[$i$], where Group_Sum[$i$] represents a total number of sub-channels in group $i$ to group $L-1$ ($0 \leq i \leq L-1$), and L is the total number of groups including all of the N sub-channels. In any of the previous embodiments, the method might further comprise grouping the sub-channels into the plurality of groups based on a binary expansion ($i_n$, ... , $i_1$) of an index of each of the N sub-channels according to $$\left(\sum_{j=1}^{n} i_j \cdot j\right) = l,$$

where $i_j \in \{0,1\}$, $n = \log_2(N)$, and $l$ comprises an index of each group of the plurality of groups. In any of the previous embodiments, selecting the number of sub-channels from the plurality of sub-channels in the localization area might comprise selecting the number of sub-channels according to an order of the plurality of sub-channels in the localization area. In any of the previous embodiments, the order might be determined based on one or more metrics associated with the sub-channels. In any of the previous embodiments, the method might further comprise sorting the sub-channels in each group of sub-channels that includes at least one sub-channel in the localization area, according to metrics associated with the sub-channels; and identifying sub-channels for the localization area based on a sort order of the sub-channels. In any of the previous embodiments, the N sub-channels might comprise sub-channels corresponding to bit positions to be frozen due to puncturing or shortening, and the selecting operations might comprise selecting sub-channels corresponding to bit positions that are not frozen due to puncturing or shortening. In any of the previous embodiments, K might comprise a number of information bit positions that are to be encoded, and N−K might comprise a number of frozen bit positions. In any of the previous embodiments, the method might further comprise encoding the bits that are to be encoded onto the K selected sub-channels to generate codewords and transmitting the codewords. In any of the previous embodiments, the method might further comprise determining a second localization area for selection of sub-channels to carry further bits that are to be encoded. In any of the previous embodiments, the second localization area might include a different number of the N sub-channels than the localization area. In any of the previous embodiments, the second localization area might be determined responsive to a change in a coding parameter of the one or more coding parameters. In any of the previous embodiments, determining the second localization area might comprise determining the second localization area based on a coding parameter other than the one or more coding parameters.

In accordance with another embodiment of the present disclosure, an apparatus comprises an encoder to encode, onto a number K of N sub-channels that are defined by a code and that have associated reliabilities for input bits at N input bit positions, input bits that are to be encoded; and a sub-channel processing module to determine, based on one or more coding parameters, a localization area that includes a plurality of the N sub-channels and is located below fewer than K of the N sub-channels in a partial order of the N sub-channels; to select the fewer than K sub-channels of the N sub-channels above the localization area in the partial order; and to select a number of sub-channels from the plurality of sub-channels in the localization area, wherein the selected fewer than K sub-channels and the number of sub-channels selected from the plurality of sub-channels in the localization area comprise K sub-channels to carry the bits that are to be encoded.

In the previous embodiment, the one or more coding parameters might comprise any one or more of: code rate, mother code block length N, code block length M, information block length K, rate matching scheme, and SNR. In any of the previous embodiments, the partial order might comprise a plurality of groups of sub-channels comprising respective subsets of the N sub-channels, and the sub-channel processing module might be further configured to determine a group of the plurality of groups to which a Kth sub-channel from a highest end of the partial order belongs, and to determine the localization area as a number of groups adjacent to and including the group to which the Kth sub-channel from the highest end of the partial order belongs. In any of the previous embodiments, the sub-channel processing module might be configured to determine the localization area by determining a first number of adjacent groups in the partial order above the group to which the Kth sub-channel from the highest end of the partial order belongs and a second number of adjacent groups in the partial order below the group to which the Kth sub-channel from the highest end of the partial order belongs. In any of the previous embodiments, the sub-channel processing module might be configured to determine the first number of adjacent groups and the second number of adjacent groups according to:

if Group_Sum[$i$]−$K$<$K$−Group_Sum[$i$+1], then
$\Delta L1 >= \Delta L2$;

otherwise, $\Delta L1 <= \Delta L2$, where Group_Sum[$i$] represents a total number of sub-channels in group i to group L−1 ($0 \leq i \leq L-1$), group i is the group to which the Kth sub-channel from the highest end of the partial order belongs, L is the total number of groups including all of the N sub-channels, $\Delta L1$ is the first number of adjacent groups, and $\Delta L2$ is the second number of adjacent groups. In any of the previous embodiments, the sub-channel processing module might be configured to determine the localization area by determining the localization area as a number of sub-channels adjacent to and including a Kth sub-channel from a highest end of the partial order. In any of the previous embodiments, the sub-channel processing module might be configured to determine the localization area by determining a first number of adjacent nodes in the partial order above the Kth sub-channel from the highest end of the partial order and a second number of adjacent nodes in the partial order below the Kth sub-channel from the highest end of the partial order. In any of the previous embodiments, the partial order might comprise a plurality of groups of sub-channels comprising respective subsets of the N sub-channels, and the sub-channel processing module might be further configured to determine a group of the plurality of groups to which the Kth sub-channel from the highest end of the partial order belongs, and to determine a total number of sub-channels in the localization area based on numbers of sub-channels in groups adjacent to the group to which the Kth sub-channel from the highest end of the partial order belongs. In any of the previous embodiments, the sub-channel processing module might be configured to determine the group to which the Kth sub-channel from the highest end of the partial order belongs by determining an ith group of the plurality of groups, for which Group_Sum[$i$+1]<$K$<=Group_Sum[$i$], where Group_Sum[$i$] represents a total number of sub-channels in group i to group L−1 ($0 \leq i \leq L-1$), and L is the total number of groups including all of the N-sub-channels. In any of the previous embodiments, the sub-channel processing module might be further configured to group the sub-channels into the plurality of groups based on a binary expansion ($i_n, \ldots, i_1$) of an index of each of the N sub-channels according to $$\left( \sum_{j=1}^{n} i_j \cdot j \right) = l,$$

where $i_j \in \{0,1\}$, $n = \log_2(N)$, and l comprises an index of each group of the plurality of groups. In any of the previous embodiments, the sub-channel processing module might be configured to select a number of sub-channels from the plurality of sub-channels in the localization area by selecting the number of sub-channels according to an order of the plurality of sub-channels in the localization area. In any of the previous embodiments, the order might be determined based on one or more metrics associated with the sub-channels. In any of the previous embodiments, the sub-channel processing module might be further configured to sort the sub-channels in each group of sub-channels that includes at least one sub-channel in the localization area, according to metrics associated with the sub-channels, and to identify sub-channels for the localization area based on a sort order of the sub-channels. In any of the previous embodiments, the N sub-channels might comprise sub-channels corresponding to frozen bit positions due to puncturing or shortening, and the sub-channel processing module might be configured to select sub-channels corresponding to bit positions that are not frozen due to puncturing or shortening. In any of the previous embodiments, K might comprise a number of information bit positions that are to be encoded, and N−K might comprise a number of frozen bit positions. In any of the previous embodiments, the encoder might be configured to encode the bits that are to be encoded onto the K selected sub-channels to generate codewords, and the apparatus might further comprise a transmitter, coupled to the encoder, to transmit the codewords. In any of the previous embodiments, the sub-channel processing module might be further configured to determine a second localization area for selection of sub-channels to carry further bits that are to be encoded. In any of the previous embodiments, the second localization area might include a different number of the N sub-channels than the localization area. In any of the previous embodiments, the second localization area might be determined responsive to a change in a coding parameter of the one or more coding parameters. In any of the previous embodiments, the sub-channel processing module might be configured to determine the second localization area based on a coding parameter other than the one or more coding parameters. In any of the previous embodiments, the apparatus might be one of user equipment or communication network equipment.

In accordance with another embodiment of the present disclosure, a method comprises determining, from N sub-channels that are defined by a code and that have associated reliabilities for input bits at N input bit positions, a number K of the sub-channels to carry bits that are to be encoded; selecting fewer than K most reliable sub-channels of the N sub-channels based on a partial order of the N sub-channels in which reliabilities of at least some of N sub-channels relative to each other are independent of a transmission model; and selecting a number of sub-channels from next most reliable sub-channels of the N sub-channels in the partial order, based on a transmission model dependent function, wherein the selected most reliable sub-channels and the selected next most reliable sub-channels comprise K sub-channels to carry the bits that are to be encoded.

In the previous embodiment, a total number of the most reliable sub-channels and the next most reliable sub-channels might be greater than K, and selecting the number of sub-channels from the next most reliable sub-channels might comprise selecting the number of sub-channels according to an order of the next most reliable sub-channels that is based on the transmission model dependent function. In any of the previous embodiments, the next most reliable sub-channels might comprise a boundary subset in the partial order, above which a total number of sub-channels in the partial order is less than K and a total number of sub-channels in the boundary subset and above the boundary subset in the partial order might be greater than K, and the method might further comprise determining an order of the sub-channels in the boundary subset based on the transmission model dependent function. In any of the previous embodiments, the method might further comprise identifying the sub-channels in the boundary subset based on a binary expansion $(i_n, \ldots, i_1)$ of sub-channel indices i and a condition $$\left\{(i_n, \ldots, i_1) \middle| \left(\sum_{j=1}^{n} i_j \cdot j\right) = l\right\},$$

where $i_j \in \{0,1\}$, where l comprises an index of each of one or more groups of sub-channels in the boundary subset. In any of the previous embodiments, the order might be determined by comparing metrics associated with the next most reliable sub-channels based on the partial order. In any of the previous embodiments, $N=2^n$, and the transmission model dependent function might be a function of SNR, an index of a respective sub-channel, and n. In any of the previous embodiments, the transmission model dependent function might yield no conflict with the partial order and sufficient resolution to order the sub-channels in an identified region. In any of the previous embodiments, the transmission model dependent function might comprise, for each sub-channel of index i, $$\text{metric} = \sum_{j=1}^{n} i_j \beta^{j-1},$$

where the index i has a binary expansion $(i_n, \ldots, i_1)$, $\beta = g(\text{SNR}, n)$, and $|\beta| > 1$. In any of the previous embodiments, the N sub-channels might comprise sub-channels corresponding to frozen bit positions due to puncturing or shortening, and at least one of the selecting the fewer than K most reliable sub-channels or the selecting the number of sub-channels might comprise selecting sub-channels corresponding to bit positions that are not frozen due to puncturing or shortening. In any of the previous embodiments, K might comprise a number of information bit positions that are to be encoded, and N−K might comprise a number of frozen bit positions. In any of the previous embodiments, the method might further comprise encoding the bits that are to be encoded onto the K selected sub-channels to generate codewords and transmitting the codewords.

In accordance with another embodiment of the present disclosure, an apparatus comprises an encoder to encode, onto a number K of N sub-channels that are defined by a code and that have associated reliabilities for input bits at N input bit positions, input bits that are to be encoded; and a sub-channel selector coupled to the encoder, to select fewer than K most reliable sub-channels of the N sub-channels based on a partial order of the N sub-channels in which reliabilities of at least some of N sub-channels relative to each other are independent of a transmission model, and to select a number of sub-channels from next most reliable sub-channels of the N sub-channels in the partial order, based on a transmission model dependent function, wherein the selected most reliable sub-channels and the selected next most reliable sub-channels comprise K sub-channels to carry the bits that are to be encoded.

In the previous embodiment, a total number of the most reliable sub-channels and the next most reliable sub-channels might be greater than K, and the sub-channel selector might be configured to select the number of sub-channels from the next most reliable sub-channels by selecting the number of sub-channels according to an order of the next most reliable sub-channels that is based on the transmission model dependent function. In any of the previous embodiments, the next most reliable sub-channels might comprise a boundary subset in the partial order, above which a total number of sub-channels in the partial order is less than K and wherein a total number of sub-channels in the boundary subset and above the boundary subset in the partial order is greater than K, and the sub-channel selector might be configured to determine the order of the sub-channels in the boundary subset based on the transmission model dependent function. In any of the previous embodiments, the sub-channel selector might be configured to identify the sub-channels in the boundary subset based on a binary expansion $(i_n, \ldots, i_1)$ of sub-channel indices i and a condition $$\left\{ (i_n, \ldots, i_1) \,\middle|\, \left( \sum_{j=1}^{n} i_j \cdot j \right) = l \right\},$$

where $i_j \in \{0,1\}$, where l comprises an index of each of one or more groups of sub-channels in the boundary subset. In any of the previous embodiments, the sub-channel selector might be configured to determine the order by comparing metrics associated with the next most reliable sub-channels based on the partial order. In any of the previous embodiments, $N=2^n$, and the transmission model dependent function might be a function of SNR, an index of a respective sub-channel, and n. In any of the previous embodiments, the transmission model dependent function might yield no conflict with the partial order and sufficient resolution to order the sub-channels in an identified region. In any of the previous embodiments, the transmission model dependent function might comprise, for each sub-channel of index i, $$\text{metric} = \sum_{j=1}^{n} i_j \beta^{j-1},$$

where the index i has a binary expansion $(i_n, \ldots, i_1)$, $\beta = g(SNR, n)$, and $|\beta| > 1$. In any of the previous embodiments, the N sub-channels might comprise sub-channels corresponding to frozen bit positions due to puncturing or shortening, and the sub-channel selector might be configured to select sub-channels corresponding to bit positions that are not frozen due to puncturing or shortening. In any of the previous embodiments, K might comprise a number of information bit positions that are to be encoded, and N−K might comprise a number of frozen bit positions. In any of the previous embodiments, the apparatus might further comprise a transmitter, coupled to the encoder, to transmit codewords generated by the encoder in encoding the bits that are to be encoded onto the K selected sub-channels. In any of the previous embodiments, the apparatus might be one of user equipment or communication network equipment.

BRIEF DESCRIPTION OF THE DRAWINGS

Examples of embodiments of the invention will now be described in greater detail with reference to the accompanying drawings.

FIG. 1 is a diagram showing one example of how a polar coding generator matrix can be produced from a kernel.

FIG. 2 is a diagram showing an example use of a polar coding generator matrix for producing codewords and a schematic illustration of an example polar encoder.

DETAILED DESCRIPTION OF ILLUSTRATIVE EMBODIMENTS

FIG. 1 is a diagram showing, by way of an illustrative example, how a polar coding generator matrix can be produced from a kernel $G_2$ 100. Note that FIG. 1 is an example. Other forms of kernel are also possible. Polarization comes from the "nested" way in which a generator matrix is created from a kernel (or combination of kernels).

The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

A polar code can be formed from a Kronecker product matrix based on matrix $G_2$ 100. For a polar code having codewords of length $N=2^m$, the generator matrix is $G_2^{\otimes m}$. FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N-K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. For ease of description, all-zero frozen bits are considered herein, and may be generally preferred.

Figure 3:
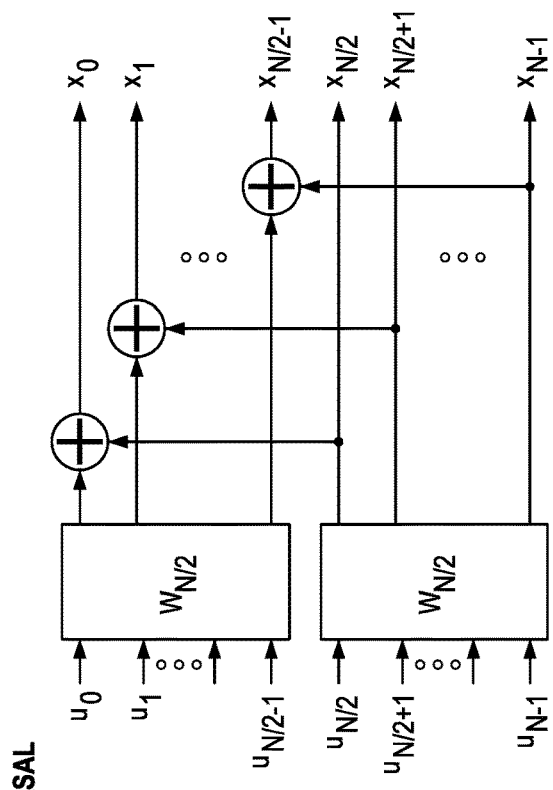
FIG. 3 includes block diagrams that illustrate polar coding without bit reversal and with bit reversal.
Figure 3:
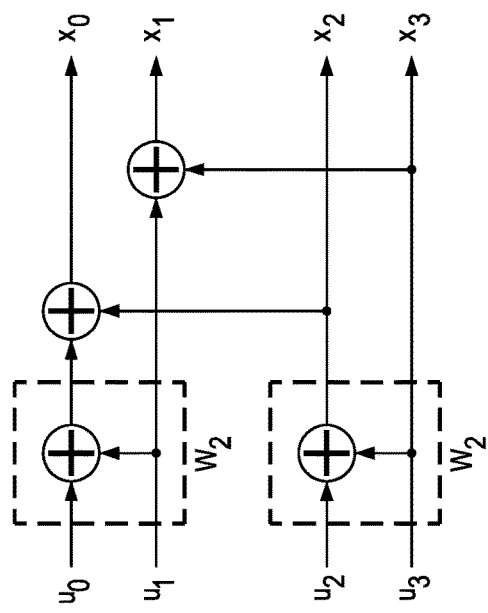
Figure 3:
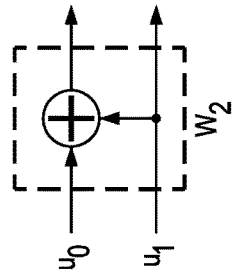
Figure 3:
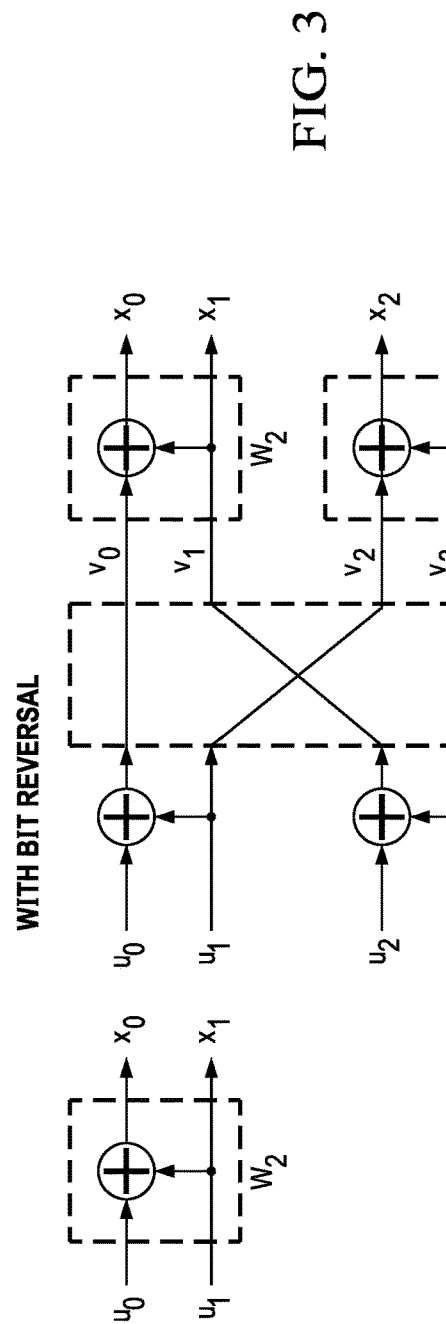

FIG. 3 includes block diagrams that illustrate polar coding without and with bit reversal. The example polar encoder in FIG. 2 is without bit reversal, and is consistent with the example 2-by-2 kernel and higher-order encoder examples at the top of FIG. 3. Bit reversal might not change the structure of a kernel, as shown in FIG. 3 with the same 2-by-2 kernel for the examples without and with bit reversal. An example of a higher-order polar encoder with 2-by-2 kernels and bit reversal represented at 14 is shown at the bottom right of FIG. 3.

In more general terms, the output of a polar encoder is $x_0^{N-1} = u_0^{N-1} G_N$, where $G_N = F^{\otimes n}$ is an N-by-N generator matrix, $N=2^n$, $n \geq 1$, and $F=G_2$ 100 in FIG. 1. For bit reversal, $G_N = B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate of the physical channel. A reliability sequence (reliable and unreliable positions) could be calculated based on assumed or measured characteristics of the physical channel before the information is transmitted over the channel, for example. In theory, the frozen bits can be set to any value as long as the location and value of each frozen bit is known to both the encoder and the decoder. In conventional applications, the frozen bits are all set to zero.

With a sufficiently long code length, a code designed according to polarization theory can reach the channel capacity in a binary memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^2$ bits in an Additive White Gaussian Noise (AWGN) channel. Such a long code length is impractical in wireless communications, for example.

Error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a-Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from K information bits including one or more CRC bits, and (N-K) frozen bits. In this example, starting with a number of input bits, a CRC is calculated and appended to the input bits to produce a set of information bits including the input bits and the CRC bits. The remaining (N-K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

Figure 4:
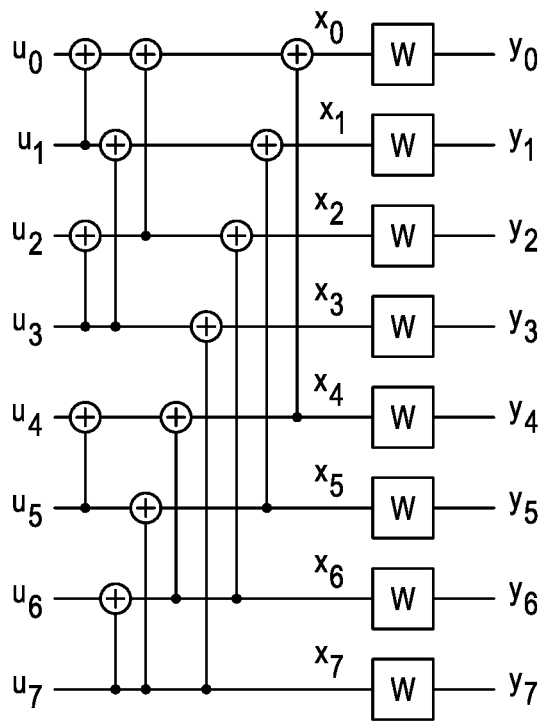
FIG. 4 illustrates an example of an SC (Successive Cancellation) decoding algorithm.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit. FIG. 4 illustrates an example of an SC decoding algorithm.

Another type of polar decoding algorithm with greater space efficiency, referred to as a List decoder, is described in "List Decoding of Polar Codes" by Tal and Vardy, *Proceedings of the 2011 IEEE International Symposium on Information Theory*, pp. 1-5 (July 2011). In a List decoder, successive levels of a binary decision tree are generated, each level corresponding to a decision on a respective unknown bit. Each path in the decision tree from the root node to leaf nodes represents a possible partial decoded sequence of unknown bits and has a corresponding likelihood. During generation of the decision tree, at each level of the decision tree where the number of paths grows beyond a set threshold L, the L paths having the highest likelihoods are identified, and the remaining paths are discarded. If the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For bit-level decoding, a decoding path generates two leaf branches (bit=0|1) for a next decoding bit. An SC decoder tracks only one decoding path. After the value of a decoded bit is estimated, the other possible value is ignored. Decoding continues with the next bit, assuming that each previous bit has been correctly estimated when updating partial sum results.

Although tracking multiple decoding paths as in SCL decoding may offer better decoding performance than single-path tracking as in SC decoders, multi-path decoder size and complexity increases with codeword length and with list size L. For example, for a codeword length N=8 with a 2-by-2 kernel, there are $2^8=256$ possibilities for estimated values $û_0$ to $û_7$. Other kernel sizes have different numbers of possibilities, such as $3^8$ for N=8 and a 3-by-3 kernel. As codeword length increases, the number of possibilities grows exponentially, and tracking of all decoding paths for all combinations of $û_x$ becomes impractical. By tracking multiple decoding paths according to a list of size L, SCL decoders may still offer better decoding performance than SC decoders, with reasonable size and complexity. An SCL decoder monitors the best L decoding paths and estimates information bit values for the L decoding paths by combining Log Likelihood Ratio (LLR) values with previously computed partial sum values.

In one implementation, each decoding path from the root (decoded bit #0) of a decoding tree is associated with a Path Metric (PM). A decoding path appends each newly decoded bit to previous estimated values. After the LLR computations for each decoded bit, path metrics are continuously updated using the LLR values as follows:

if the LLR value >=0
PM[0, i+1]=PM[i]
PM[1, i+1]=PM[i]+|LLR|
if the LLR value <0
PM[0, i+1]=PM[i]+|LLR|
PM[1, i+1]=PM[i].

In that example, the best decoding paths have the smallest PM values. If an LLR is less than 0, then the decoded bit is most likely a 1, so the next PM for the estimated value 1 (PM[1, i+1]) remains the same as the current path metric, and the absolute LLR value is added to the PM for the estimated value 0 (PM[0, i+1]), in effect "penalizing" the less likely path with the absolute LLR value. If the LLR value is near 0, then the decision for the value of $û_x$ is unreliable and the PM penalty on the penalized path is small.

For bit-level decoding, each decoding path in a decoding tree produces 2 new decoding paths for every decoded bit, in the case of a 2-by-2 kernel. Each "leaf" decoding path inherits the LLR, partial sum, and PM values from its parent. After the number of decoding paths reaches L, an SCL decoder selects, based on the 2L PMs for the 2L candidate decoding paths, the L paths with the lowest PMs, and drops the other L decoding paths. The selected L paths are sorted using the PMs. For example, path sorting could assign path identifiers (IDs) or indices to the selected paths, with the path having the best PM being assigned a path ID #1, a path with the worst PM being assigned path ID #L, and other paths being assigned path IDs #2 to #(L−1) in accordance with their PMs. New decoding path IDs could be assigned after each sort step, following estimation of each codeword bit.

Figure 5:
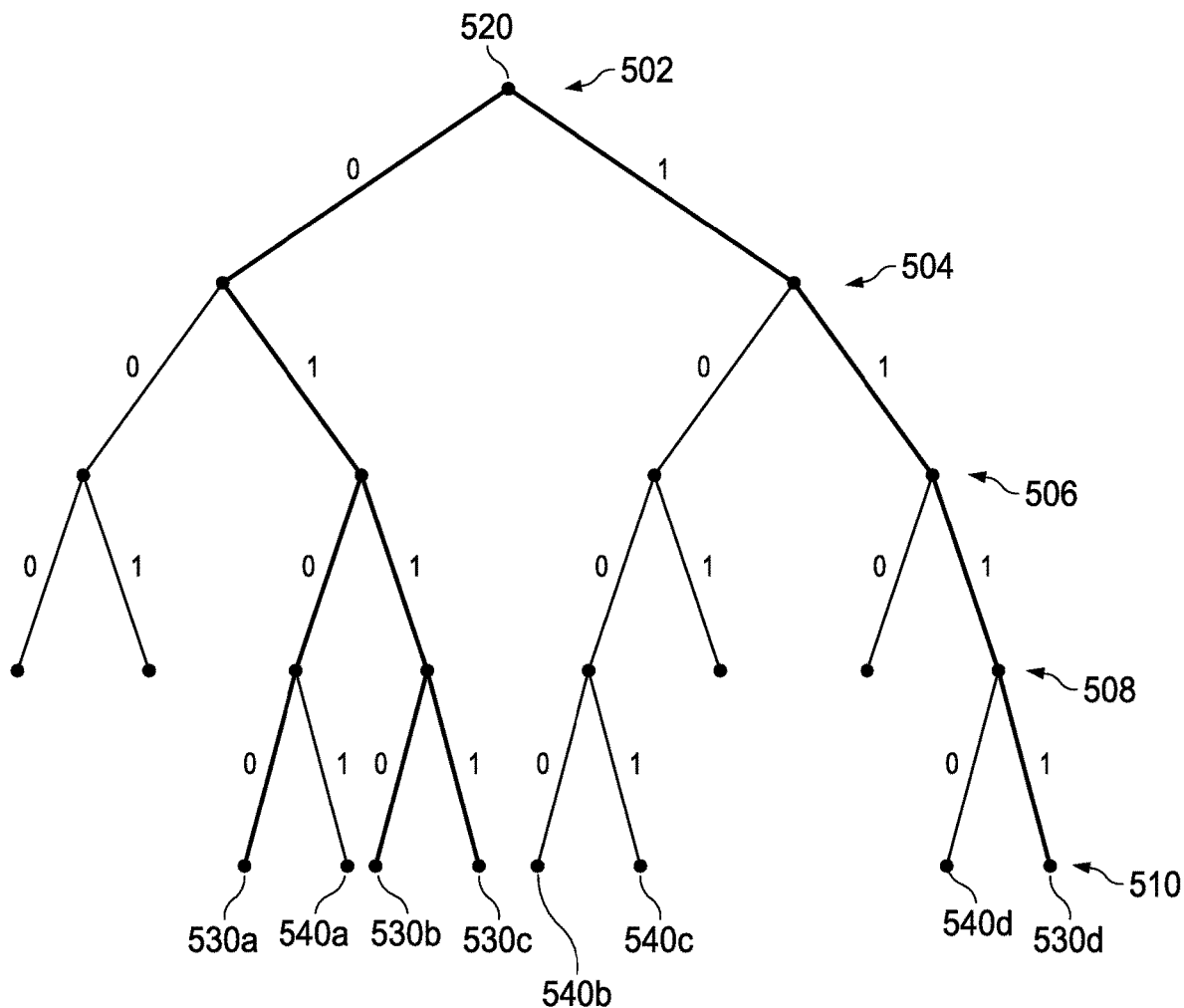
FIG. 5 is a diagram showing a portion of an example decision list tree whose width is limited by a maximum given list size and used in an SCL (Successive Cancellation List) polar decoder.

FIG. 5 is a diagram showing a portion of an example decision list tree whose width is limited by a maximum given list size and used in an SCL polar decoder. In FIG. 5 the list size L is 4. Five levels 502, 504, 506, 508, 510 of the decision tree are illustrated. Although five levels are illustrated, it should be understood that a decision tree to decode N bits would have N+1 levels. At each level after the root level 502, each one of up to 4 surviving decoding paths is extended by one bit. The leaf or child nodes of root node 520 represent possible choices for a first bit, and subsequent leaf nodes represent possible choices for subsequent bits. The decoding path from the root node 520 to leaf node 530a, for example, represents an estimated codeword bit sequence: 0, 1, 0, 0. At level 508, the number of possible paths is greater than L, so L paths having the highest likelihood (best PMs) are identified, and the remaining paths are discarded. The decoding paths that survive after the path sort at level 506 are shown in bold in FIG. 5. Similarly, at level 510, the number of possible paths is again greater than L, so the L paths having the highest likelihood (best PMs) are identified, and the remaining paths are again discarded. In the example shown, the paths terminating in leaf nodes 530a, 530b, 530c, and 530d represent the highest likelihood paths. The paths terminating in leaf nodes 540a, 540b, 540c, and 540d are the lower likelihood paths which are discarded.

SCL decoding can be further divided into CRC-aided list decoding and pure list decoding, in which survivor paths with the highest likelihood are selected. SC decoding is a special case of pure list decoding, with list size L=1. A CRC may provide better error correction performance in the final path selection, but is optional in SCL decoding. Other operations, such as a parity check based on parity check or "PC" bits that are included in an input vector, could be used instead of CRC in final path selection during decoding.

SCL decoding may improve the performance of a polar code for a limited code size. However, compared with the similar code length and code rates of Low Density Parity Check (LDPC) codes and Turbo codes, SCL decoding may have a worse Block Error Rate (BLER) than well-designed LDPC and Turbo codes. CRC-aided SCL (CA-SCL) decoding may improve the performance of a polar code with a limited code length. For example, a CA-SCL decoder with a list size L=32 could provide for much better performance than LDPC and Turbo codes with similar computational complexity.

In an AWGN channel, a polar code in effect divides a channel into N sub-channels. N is referred to as mother code length and is always a power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 6:
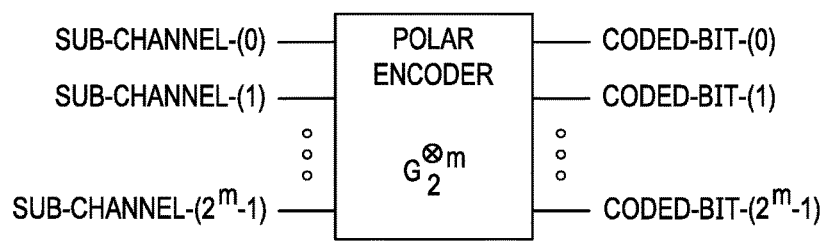
FIG. 6 is a block diagram illustrating an example of a polar encoder based on a 2-by-2 kernel.

Polar encoders based on Kronecker products of a 2-by-2 Arikan kernel $G_2$ are described above. FIG. 6 is a block diagram illustrating an example of a polar encoder based on a 2-by-2 kernel. Sub-channels and coded bits are labeled in FIG. 6, and a channel is divided into N sub-channels by a polar code as noted above. An information block and frozen bits are allocated onto the N sub-channels, and the resultant N-sized vector is multiplied with an N-by-N Kronecker matrix by the polar encoder to generate a codeword that includes N coded bits. An information block includes at least information bits and could also include assistant bits such as CRC bits or PC bits. A sub-channel selector could be coupled to the polar encoder to select at least sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels such as prime-number kernels (e.g., 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over the sub-channels. Some sub-channels have high capacity, and some sub-channels have low capacity. Put another way, some sub-channels have high Signal-to-Noise Ratio (SNR) and others have low SNR. These metrics are examples of characteristics that could be used to quantify or classify sub-channel "reliability." Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_1$ could instead be computed, and one of the mother code length sequences could be selected for a particular code based on preferred code length. Another possible option involves computing multiple ordered sequences in terms of SNR values, for uplink communications for example, and selecting an ordered sequence based on measured SNR.

There are also several methods to compute sub-channel reliabilities. For example, Mori R, Tanaka T. Performance and construction of polar codes on symmetric binary-input memoryless channels[C]//Information Theory, 2009. ISIT 2009. IEEE International Symposium on. IEEE, 2009: 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. Because the method relies on iterative calculations of LLR values for each sub-channel, it is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes a training sequence that is known to the decoder on different sub-channels. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method. This method also relies on a large number of simulation runs to ensure reliability accuracy over the randomness, thus resulting in significant computing latency.

A Gaussian-approximation (GA) method proposed in P. Trifonov, "Efficient design and decoding of polar codes." IEEE Trans. on Communications 60.11 (2012): 3221-3227, assumes that every coded bit is subjected to an equal error probability. From the error probability, the reliabilities over the sub-channels are obtained with a DE algorithm. Because this error probability on the coded bits is related to the receiving SNR, this method is SNR-related and is computationally complex.

Another GA method proposed in J. Dai, K. Niu, Z. Si, J. Lin, "Evaluation and Optimization of Gaussian Approximation for Polar Codes", May 2016, also assumes that every coded bit is subjected to an equal error probability. From the error probability, the reliabilities over the sub-channels are obtained with a DE algorithm. Because this error probability on the coded bits is related to the receiving SNR, this method is also SNR-related and computationally complex.

An SNR-independent polarization weight (PW) method is disclosed in R1-1611254, "Details of the Polar Code Design", Huawei & HiSilicon, 3GPP TSG RAN $WG_1$ Meeting #87. The reliability of a sub-channel is measured by the corresponding beta-expansion values, which is given by a closed-form formula as a function of the binary representation of the sub-channel index. The reliability measure is SNR-independent, and can lead to a single nested ordered sub-channel sequence for different coding rates and block lengths. In addition, the sequence could be substantially compressed due to its special nested and symmetric properties. The sequence could be calculated offline and stored in memory for use to provide a lower implementation and computational complexity relative to other methods.

As mentioned above, there are several ways to generate an ordered sequence from a kernel and its generator matrix via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a Hamming weight as disclosed in U.S. Patent Application No. 62/438,565, filed on Dec. 23, 2016, both of which are entirely incorporated herein by reference. Other techniques could also or instead be used.

Ordered sequence computations could be performed online based on observed channel conditions to compute dynamic ordered sequences, offline and in advance to store pre-computed and static ordered sequences for subsequent use in coding, or partially online and partially offline. In mobile wireless communications, the radio channel is time-varying. It may be impractical to consume significant communication bandwidth and processing resources for online sequence computing methods with high computational complexity and latency including genie-aided, DE and GA based methods. Offline computation of these methods may therefore be used instead, in conjunction with fixing a working SNR or reference SNR for a particular combination of code length and code rate for offline computation of multiple static ordered sequences according to these methods. However, simple online sequence generation methods, or online Polar construction methods, might still be desired, in that they generally consume no or much less memory, and may be more flexible and adaptive to time-varying wireless channel conditions.

Thus, methods like genie-aided, DE, and GA are complicated to perform online, and therefore such methods tend to be used offline instead. Simpler online generation methods, or online Polar construction methods, might still be desired due to higher flexibility/adaptability and no or much lower memory costs than complex offline methods. There are several methods that aim to directly find the sub-channel subset to carry the information bits without knowing the complete reliability ordering among all the sub-channels, thus potentially making online Polar construction feasible. For instance, interweaving-based methods, as disclosed in U.S. Patent Application No. 62/463,128 entitled "Apparatus and Methods of Specifying Ordered Sequences of Coding Sub-Channels" filed on Feb. 24, 2017 and incorporated herein by reference in its entirety, could be performed online and may have much lower complexity and memory cost compared to traditional offline methods. Localization-based methods, as disclosed in U.S. Patent Application No. 62/463,289 entitled "Apparatus and Methods for Coding Sub-Channel Selection" filed on Feb. 24, 2017 and incorporated herein by reference in its entirety, could also be performed online with tolerable computational complexity but no pre-storage memory costs.

In light of all the above sequence generation or Polar construction methods and their variants, it might be preferable to establish a more general framework for ordered sequence determination, which has flexibility and adaptability to support one or more of the following:

one or multiple sequences for different length N;

one or multiple sequences for different SNR (i.e., SNR dependent or independent): coding rate may also affect the working SNR, and therefore there could be multiple sequences for different coding rate groups for a single mother code length N;

a general extension of PW-based ordering, to include other online and/or offline sequence determination/generation methods;

lower implementation cost in terms of memory cost, computational complexity, and/or latency compared with 1) offline pre-storing multiple complete ordered sequences in a memory, and/or 2) online determination of sequences or information/frozen/other bit positions or sub-channels dynamically;

a strong theory to endorse performance.

Embodiments disclosed herein may provide a potential solution to instantiation of such a general framework.

It has been found that, among ordered sequences generated by different methods, the ordering of a portion of sub-channels is the same and only some sub-channels are ordered differently in different ordered sequences. In the case of a single, nested ordered sequence, the ordering of sub-channels for any code length is the same as the ordering of those sub-channels for a longer code length. Even for non-nested ordered sequences, only a small number of sub-channels have a different order between ordered sequences for different code lengths. Partial order-based localization for code construction as disclosed herein avoids the need to calculate relative reliabilities of all sub-channels, and instead may involve sorting or ordering of only a smaller number of sub-channels within what is referred to herein as a localization area. Such code construction could be adaptive to any rate matching methods, coding rates, and SNRs while determining a localization area, and/or adaptive to any ordered sequence determination methods within the localization area.

In C. Schürch, "A partial order for the synthesized channels of a polar code," in Proc. of the IEEE Int. Symposium on Inform. Theory (ISIT), Barcelona, Spain, July 2016, pp. 220-224 and M. Bardet, V. Dragoi, A. Otmani, and J.-P. Tillich, "Algebraic properties of polar codes from a new polynomial formalism," in Proc. of the IEEE Int. Symposium on Inform. Theory (ISIT), Barcelona, Spain, July 2016, pp. 230-234, it is proven that, for polar codes, there exists a universal partial order that holds for any transmission model and is therefore transmission model independent. A transmission model includes one or more parameters specific to or indicative of a particular transmission scheme, channel or channel condition including, for example, a channel model, a type, a transmission/channel quality, for example as expressed in a Channel Quality Index (CQI) report, a noise level, an SNR, etc. Based on the partial order, only approximately $1/\log^{3/2}(N)$ sub-channels, rather than all N sub-channels, need to be considered for reliability ordering. The partial order provides a "tendency" or "mainstream" view about reliability distribution for a given N. U.S. Patent Application No. 62/463,289 entitled "Apparatus and Methods for Coding Sub-Channel Selection" filed on Feb. 24, 2017 and incorporated herein by reference in its entirety provides an example of sub-channel ordering based on partial order.

Figure 7:
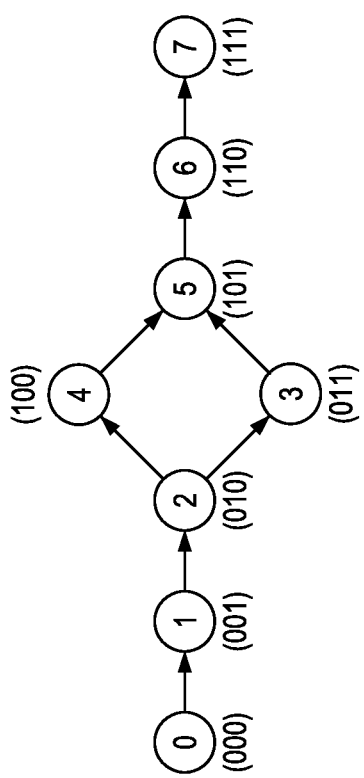
FIG. 7 is a block diagram illustrating an example partial order of N=8 sub-channels.

FIG. 7 is a block diagram illustrating an example partial order of N=8 sub-channels. Each node in the partial order in FIG. 7 represents a sub-channel, and each directed edge or arrow between nodes represents relative reliabilities of the sub-channels. References are made herein to partial orders of sub-channels and to sub-channel ordering and selection. In a representation of a partial order, nodes represent sub-channels, and sub-channel ordering and selection may involve ordering and selection of nodes. Node ordering and selection represents one example of how sub-channels may be ordered and selected, and therefore nodes and sub-channels may be referenced interchangeably. It should also be noted that sub-channels correspond to bit positions, and bit positions could include at least information bit positions and frozen bit positions. Features disclosed herein with reference to sub-channels may also or instead apply to bit positions. For example, sub-channel ordering and selection as disclosed herein are equivalent to ordering and selecting bit positions. References to nodes, sub-channels, and bits or bit positions should be interpreted accordingly.

For each edge in a partial order representation, the reliability of its source node is always smaller than its destination node for any transmission model. An edge exists between nodes in the example partial order of FIG. 7 if the source node binary index can be transformed into the destination node binary index with a single one of the following defined operations:

Operation 1: if the last (least significant) bit of a source node index is 0, changing the 0-bit from 0 to 1, as in the example of nodes 2 and 3, (0,1,0)→(0,1,1), is indicative of higher reliability for the destination node index (relative to the source node index);

Operation 2: left-swapping a 1 bit in the source node index with a bit position of an adjacent 0 bit, as in the example of nodes 2 and 4, (0,1,0)→(1,0,0), is indicative of higher reliability for the destination node index (relative to the source node index).

It should be noted that two nodes without an arrow between them can still have a fixed reliability relationship, as long as there exists at least one directed path composed of arrows between the two nodes, e.g., nodes 1 and 4, nodes 2 and 5.

Other operations may apply in other partial orders.

The edges indicate increasing reliability in the example shown. Partial orders with edges indicating decreasing reliabilities are also possible.

A partial order is "partial" in the sense that not every node, or every sub-channel which is represented by a node, has a reliability relative to all other nodes that is transmission model independent or otherwise fixed. With reference to FIG. 7, sub-channels 0, 1, 2 and 5, 6, 7 have a transmission model independent or fixed order or sequence relative to each other and all other sub-channels. From the example partial order in FIG. 7, it can be seen that sub-channels 3 and 4 both have reliabilities that are higher than the reliability of sub-channel 2 and lower than the reliability of sub-channel 5, but the reliabilities of sub-channels 3 and 4 relative to each other is not transmission model independent or otherwise fixed.

Figure 8:
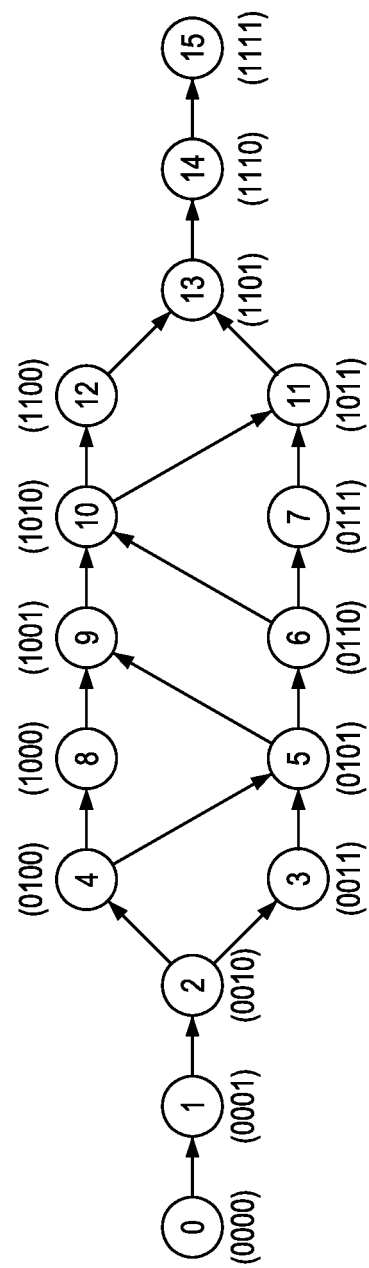
FIG. 8 is a block diagram illustrating an example partial order of N=16 sub-channels.

FIG. 8 is a block diagram illustrating an example partial order of N=16 sub-channels. As in FIG. 7, sub-channels 3 and 4 both have reliabilities that are higher than the reliability of sub-channel 2 and lower than the reliability of sub-channel 5, but the reliabilities of sub-channels 3 and 4 relative to each other is not transmission model independent or otherwise fixed. Sub-channel 8 has a higher reliability than sub-channel 4 and sub-channels 0, 1, 2 that have a lower reliability than sub-channel 4. Similarly, according to the partial order shown in FIG. 8, sub-channel 8 has a lower reliability than sub-channel 9 and sub-channels 10 to 15, all of which have a higher reliability than sub-channel 9. No other ordering of sub-channel 8 can be drawn from the partial order in FIG. 8 without reliability computations.

Some of the sub-channels can form a chain in which all nodes have a fixed relative reliability to other nodes which is transmission model independent, e.g., 0→1→2→3→5→6→7→11→13→14→15 is one of the longest chains in FIG. 8. Different chains may have common nodes. Some nodes from different chains might not have a transmission model independent or fixed-order, e.g., nodes 5 and 8, or nodes 7 and 10.

Figure 9:
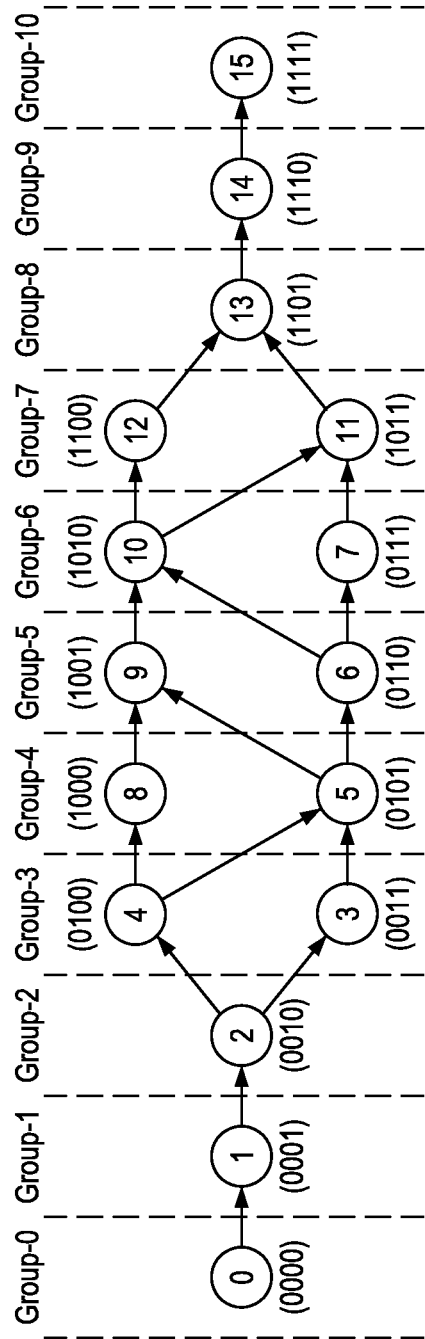
FIG. 9 is a block diagram illustrating groups of a partial order of N=16 sub-channels.

FIG. 9 is a block diagram illustrating groups of a partial order of N=16 sub-channels. A group, which could be considered a form of a "stage" of nodes in a partial order, includes a single node as shown in groups 0, 1, 2 and 8, 9, 10, or multiple nodes between which there are no edges or arrows, as shown in the intermediate groups 3, 4, 5, 6, 7. If there is no edge or arrow between nodes at the same group, then it cannot be determined, using only the partial order, which node or corresponding sub-channel has a higher reliability. This applies to nodes 3 and 4 as noted above, for example. In an embodiment, group numbers or indices are related to node/sub-channel numbers or indices, as described below by way of example.

Although reliability might generally increase with each group from left to right in FIG. 9, the nodes in each group or the corresponding sub-channels need not necessarily all have higher reliabilities than all of the nodes or corresponding sub-channels in a preceding group. For example, sub-channel 8 in group 4 has a higher reliability than sub-channel 4 in group 3, but might not necessarily have a higher reliability than sub-channel 3 in group 3. However, each group in the example shown does include one or more nodes representing sub-channel(s) having a higher reliability than a sub-channel represented by a node in a preceding group. Similarly, each group in the example shown includes one or more nodes representing sub-channel(s) having a lower reliability than a sub-channel represented by a node in a next group. In this sense, each node at any group has a relative reliability rank or order with respect to at least one node in an adjacent group.

Figure 10:
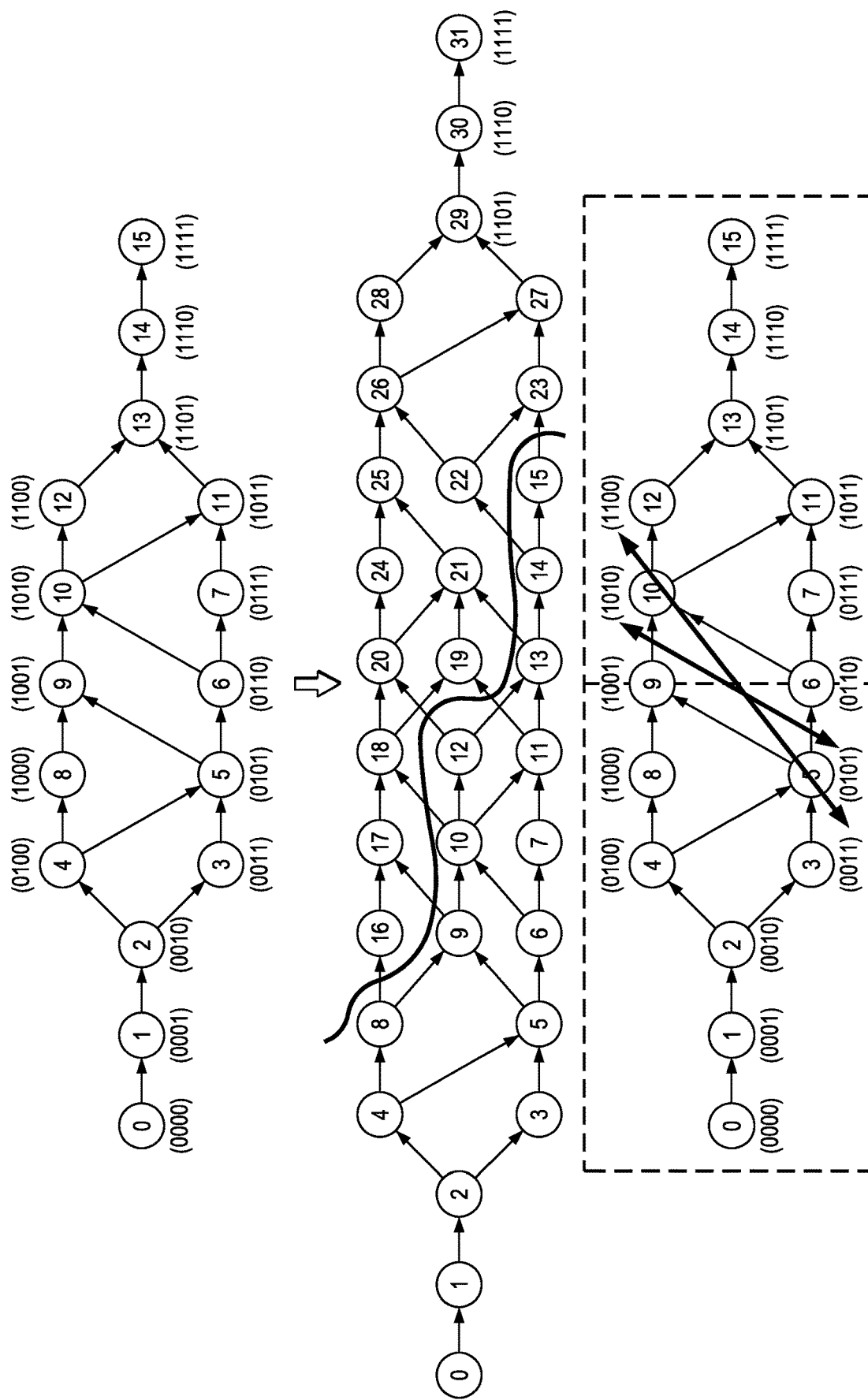
FIG. 10 includes block diagrams illustrating examples of symmetric and nested partial orders.

In some embodiments, a partial order is structurally symmetric and nested. The structural symmetry of a partial order refers to a property that, for a partial order of N nodes, if a node with index i is changed to index N−1−i (for all 0≤i<N) and the directions of all edges are reversed, then the resultant partial order is the same as the original partial order in terms of node and edge structure. Stated another way, if nodes with indices x and y have relative reliabilities such that x<y, then relative reliabilities for nodes with indices N−1−x and N−1−y are such that N−1−x>N−1−y. In FIG. 10, for example, the N=32 partial order is structurally symmetric and constructed based on an N=16 partial order, which itself is also structurally symmetric and constructed based on an N=8 partial order (FIG. 7). From a comparison of the N=16 and N=32 partial orders in FIG. 10, it can be seen that nodes 0 to 15 in the N=32 partial order correspond to nodes 0 to 15 in the N=16 partial order, and nodes 16 to 31 in the N=32 partial order also have a node and edge structure consistent with the N=16 partial order. This consistency between partial orders of different sizes is referred to herein as a nested property of partial orders.

The geometry of a symmetric partial order represented as in FIG. 10 is regular. The number of groups and the number of nodes per group is a function of only N. The maximum number of groups, for example, is $(n^2+n+2)/2$, where $N=2^n$. Not all partial orders are necessarily symmetric, but a symmetric partial order could be preferred. As illustrated in FIG. 10, a full partial order could be generated from just half of the partial order, by inverting bits in binary node indices in the example shown. Additional edges or arrows are added between nodes in a first half and nodes in a second half, e.g., nodes 13→21, nodes 12→20 in the N=32 partial order shown in FIG. 10.

Figure 11:
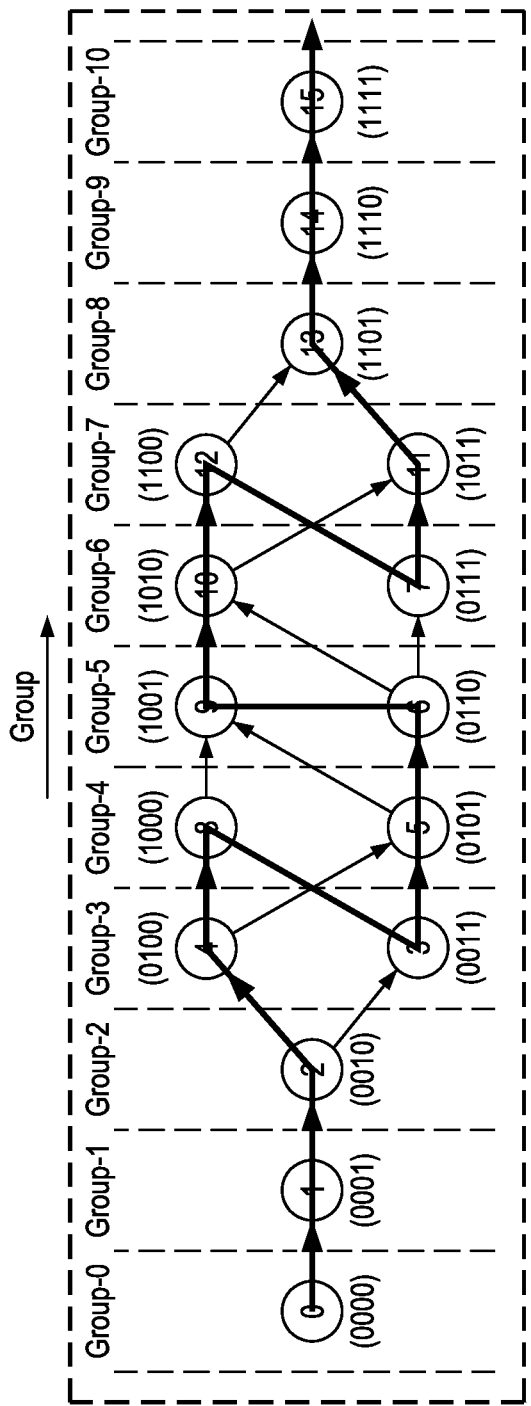
FIG. 11 is a block diagram of an ordered sub-channel sequence that conforms with the partial order.

An ordered sequence, also referred to herein as an ordered sub-channel sequence, is a path or chain that traverses all nodes. FIG. 11 is a block diagram of an ordered sub-channel sequence that conforms with the partial order. Embodiments of the present disclosure could be applied to generating ordered sub-channel sequences based on any of various sizes of partial order, and N=16 is used herein as a non-limiting example. Embodiments could also or instead be applied to generating ordered sub-channel sequences that are not necessarily based on partial orders.

In FIG. 11, the ordering among nodes {3, . . . , 12} and the sub-channels represented by those nodes is related to such transmission model parameters or conditions as a working SNR and a specific channel type. With a partial order as shown in FIG. 11, only relative reliabilities of nodes {3, . . . , 12} are derived to determine a complete chain. All other nodes in the partial order have fixed reliabilities relative to each other and all other nodes.

Like a partial order, an ordered sub-channel sequence or chain could also be symmetric and/or nested, for example, if a binary expansion associated polynomial (such as described in Chinese Patent Application No. CN 201610619696.5 referred to above) is used to compute a node or sub-channel reliability metric based upon which nodes and sub-channels are ordered. Other metric functions could be used in other embodiments.

Figure 12B:
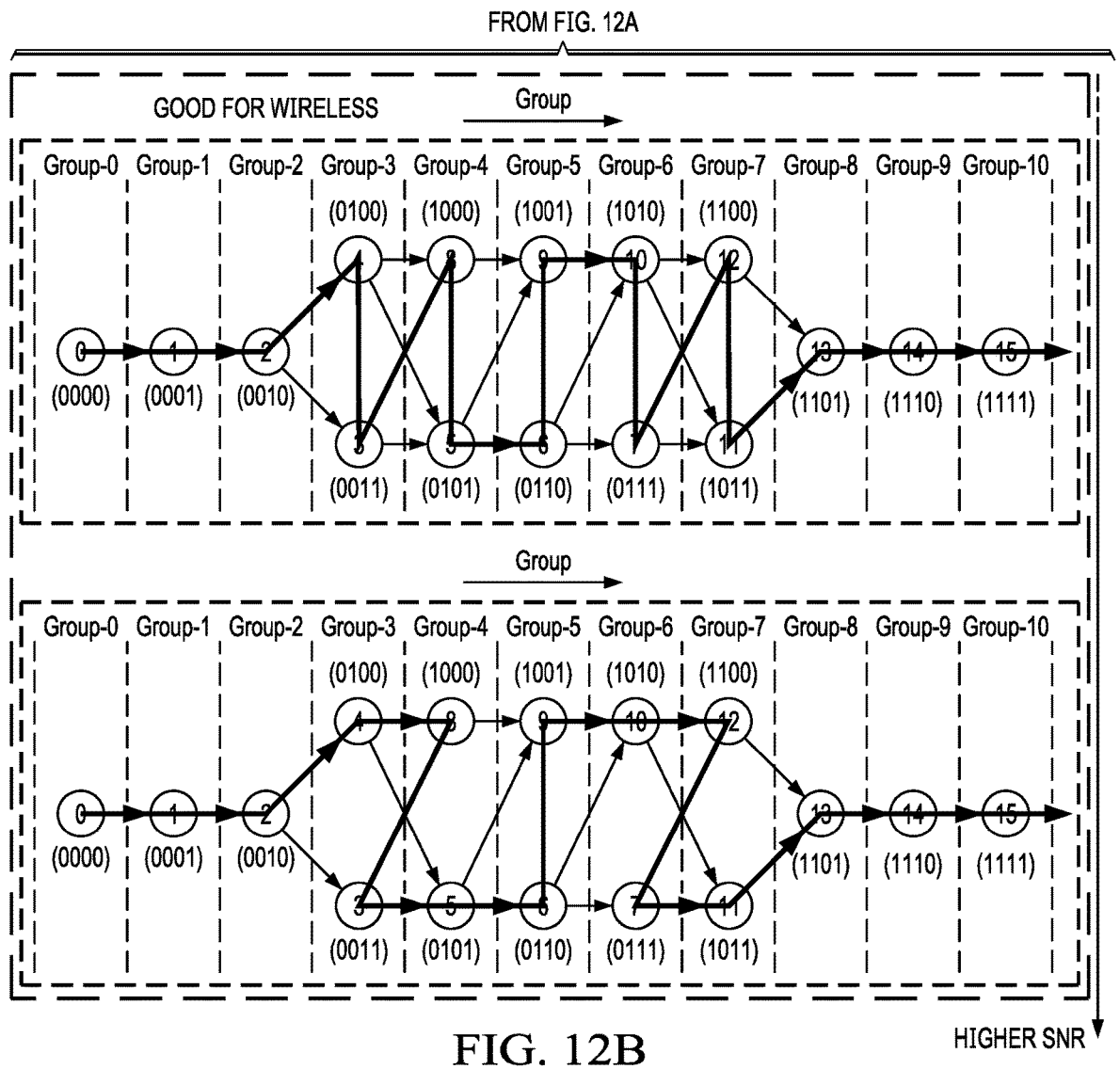
FIG. 12 includes block diagrams illustrating several examples of different ordered sub-channel sequences that conform with the partial order.

FIG. 12 includes block diagrams illustrating several examples of different ordered sub-channel sequences that conform with the partial order. In FIG. 12, the different ordered sub-channel sequences may be suitable for different levels of SNR. The examples shown in FIG. 12 were generated using a DE-GA algorithm with N=16 to generate the sequences as a function of SNR for that value of N. Different sequences could be generated using different algorithms and/or under different conditions of either or both of N and SNR. For the downlink eMBB control channel noted above, for example, the working SNR range is at the higher range of SNR in FIG. 12.

The sequences in FIG. 12 are a function of SNR and N, and none of the illustrated sequences generated by the DE method conflicts with the partial order. An ordered sub-channel sequence need not follow all edges in a partial order and may traverse between nodes that are not connected by an edge, but does not conflict with the partial order provided the sequence does not traverse nodes in a manner that conflicts with a directed edge. For example, with reference to FIG. 9, a sequence that traverses from node 9 to node 5 would conflict with the partial order. Coding based on a sequence that does not conflict with the partial order may have better performance than similar coding that is based on a sequence that conflicts with the partial order.

A partial order may specify or define an order in which some nodes or sub-channels have a transmission model independent of fixed order or sequence relative to each other and all other sub-channels. Nodes 0, 1, 2 and nodes 13, 14, 15 are examples. An ordered sub-channel sequence that traverses these nodes in any other order violates the partial order. The other sub-channels in FIG. 11 are in a transmission model dependent or variable part of the partial order, and ordering of these nodes and corresponding sub-channels and bit positions may vary with transmission model parameters such as channel model and SNR, for example. Reliability computations could be used to determine an order of such nodes, sub-channels, or bit positions in a complete ordered sequence.

The differences between the example ordered sub-channel sequences in FIG. 12 show that a single nested sequence for selection of information sub-channels is an implementation tradeoff. Although a partial order does not provide a complete single ordered sub-channel sequence on its own, a partial order can provide a tendency, anchor, or pillar for the reliability distribution of sub-channels for polar code, for example. In conjunction with a partial order, a higher resolution sorting, ordering, or ranking function could be used to form a chain or determine an ordered sub-channel sequence.

In some implementations, the higher resolution function could be a metric function that is used to compute a metric for each node and/or corresponding sub-channel. Although a binary expansion function is disclosed herein by way of example, other binary expansion functions such as described in Chinese Patent Application No. CN 201610619696.5, filed on Jul. 29, 2016 referred to above could be used. Generally, any function that depends on fixed or variable parameter(s) of a given transmission model (e.g., channel type, SNR, etc.) and/or code block length can be used. As described herein, any such function can be used to, for example, determine an ordered sub-channel sequence and/or to select K information sub-channels or N–K frozen sub-channels.

A function f(SNR,index,N) of working SNR, node or sub-channel index, and N for a polar code that is based on a 2-by-2 kernel with N=$2^n$ could be used in an embodiment to approximate an ordered sequence generated by a DE-GA algorithm which provides comparable error correction performance. A working SNR could be determined based on actual received SNR in the operating environment, and the coding rate R of the received block transmission, for example. The working SNR is determined taking at least these two factors into consideration in some embodiments. Other properties or criteria could also or instead be considered in other embodiments.

A function f(SNR,index,N) that meets any one or more of the following conditions could be preferred:
  yields no conflict with the partial order;
  yields enough resolution to rank two nodes;
  yields an ordered sub-channel sequence similar to that of DE-GA.

A polynomial function, for example, could be used as an approximation function to compute a sub-channel metric for ordering sub-channels at least in a variable or transmission model dependent part of a partial order. An example of a polynomial function is a binary beta expansion function, which could be preferred for its simplicity. For a node with index i, the n-bit binary expansion is ($i_n$, . . . , $i_1$). Node indices correspond to the natural order of the sub-channels. A corresponding polynomial that could be used in one embodiment is:

$$\text{metric} = \sum_{j=1}^{n} i_j \beta^{j-1}, \beta = g(SNR, N).$$

An equivalent expression of this metric, for a code block length $N=2^n$ ($n=\log_2(N)$) and using notation for the binary representation of sub-channel index i as $\{B_{n-1}, \ldots, B_1, B_0\}$, is:

$$\text{metric} = \sum_{j=0}^{n-1} B_j \beta^j.$$

An ordered sub-channel sequence is determined in an embodiment by sorting nodes or sub-channels according to metric values generated by this function. For such a function (for example, binary expansion), a value of $|\beta|>1$ is currently preferred in an embodiment:

If $|\beta|<1$, then the ordered sequence would conflict with the partial order;

If $|\beta|=1$, then the metric is reduced to a Hamming-type weight, and may fail to provide enough resolution to rank nodes or sub-channels in the same group;

If $|\beta|>1$, then the ordered sequence is consistent with the partial order.

Given N and a polynomial (for example, binary beta expansion) and $|\beta|>1$, a range of $\beta$ values may generate the same ordered sequence for the same N. For example, based on a binary expansion polynomial and N=16, 5 value ranges for beta, within each of which all beta values give the same full ordered sub-channel sequence, may be expressed as:

(1.3247], (1.3247, 1.4656], (1.4656, 1.618], (1.618, 1.859], (1.859, +infinit)

The $\beta=g(SNR,n)$ term in the above example, as well as SNR, can be functions of mutual channel capacity, which is dependent on code rate R=K/N. The code rate R impacts SNR, which in turn impacts P in this example.

The following illustrates an example of a beta function g(SNR,n), and how it could be impacted by code rate R. In this example, $J^{-1}$ represents SNR and I represents code rate R:

$$J^{-1}(I) \approx \begin{cases} a_{\sigma,1}I^2 + b_{\sigma,1}I + c_{\sigma,1}\sqrt{I}, & 0 \le I \le I^* \\ -a_{\sigma,2}\ln[b_{\sigma,2}(1-I)] - c_{\sigma,1}I, & I^* < I < 1 \end{cases}$$

where $a_{\sigma,1} = 1.09542, \ b_{\sigma,1} = 1.214217, \ c_{\sigma,1} = 2.33727$ $a_{\sigma,2} = 0.706692, \ b_{\sigma,2} = 0.386013, \ c_{\sigma,2} = -1.75017.$ The beta function described above is just one example of a function that is dependent or related to SNR. It is understood that other SNR dependent beta functions could be used. Generally, the term beta may be a function of the SNR as described above; or depending on the implementation, beta could be set to a fixed or predetermined value (e.g., by assuming a fixed SNR). For SNR-dependent and n-dependent $\beta$ implementations, $\beta$ could be determined from a lookup table LUT(SNR, n). According to the above example, coding rate R will determine a working SNR, based on which a beta value range could be determined according to the table below:

| β value range | SNR range, n = 4 |
|---|---|
| 1 < β <= 1.3247 | 4.0 < SNR < 8.0 |
| 1.3247 < β <= 1.4656 | 2.0 < SNR <= 4.0 |
| 1.4656 < β < 1.618 | 1.0 < SNR <= 2.0 |
| 1.618 < β < 1.839 | 0.5 < SNR <= 1.0 |
| 1.839 < β | 0 < SNR <= 0.5 |

Through extensive simulations, it has been found that $\beta=2^{0.25}$ gives very good overall performance.

Because a partial order provides a "tendency" or general distribution of sub-channel reliabilities, it may be possible to concentrate on only a portion of a partial order rather than a complete set of sub-channels, to determine the sub-channels for the information bits to be encoded. In this sense, it may be possible to turn a "global" problem of sorting a complete set of sub-channels into a "local" problem of sorting only a limited subset of sub-channels.

Figure 13:
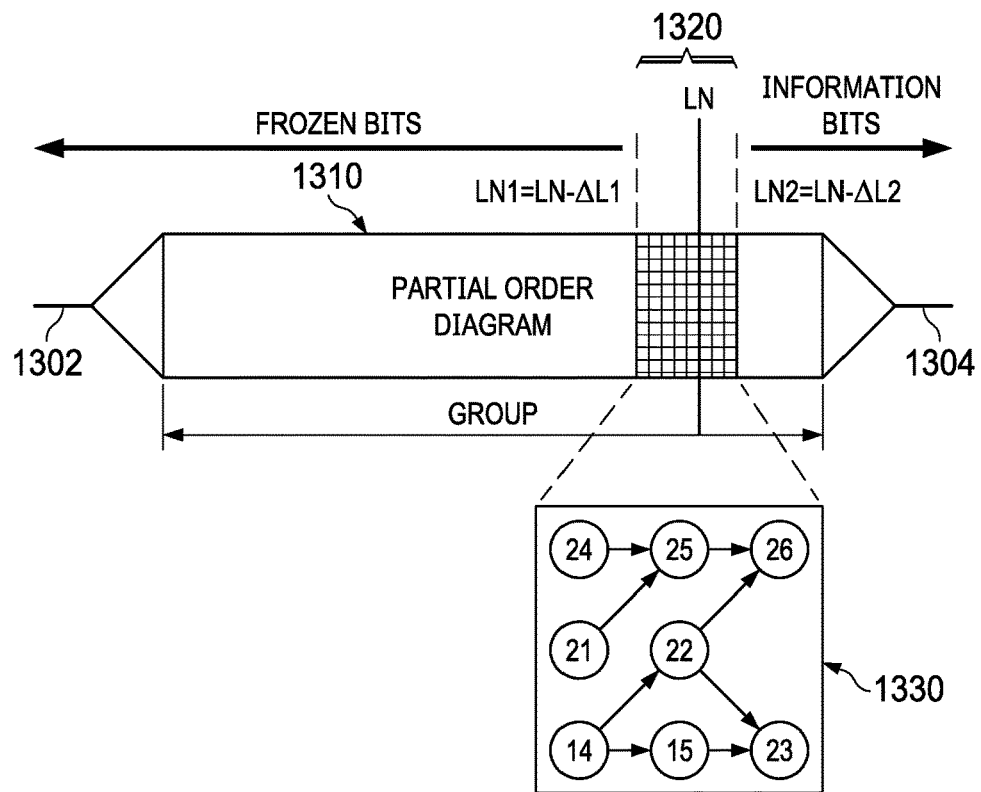
FIG. 13 is a block diagram illustrating localization of partial-order-based sub-channel ordering according to an embodiment.

FIG. 13 is a block diagram illustrating localization of partial-order-based sub-channel ordering according to an embodiment. The lines 1302, 1304 in the partial order diagram in FIG. 13 represent fixed portions, parts, or areas of the partial order in which node or sub-channel order is transmission model independent or otherwise fixed. A transmission-model dependent or otherwise variable portion of the partial order is shown at 1310. According to an aspect of the present disclosure, sub-channel sorting or ordering is localized to just a part 1320 of the variable portion 1310 of the partial order in which groups include multiple nodes for which relative reliabilities are transmission model dependent.

Localized sub-channel ordering may be used for a variety of purposes. For example, it could be used to complete the selection of a set K of sub-channels with the highest reliability (e.g., for information bits) or a set of N-K sub-channels with the lowest reliability (e.g., for frozen bits). Alternatively, it can be used to order and/or select a particular set of sub-channels of interest (e.g., sub-channels for assistant bits) among N sub-channels. Positions or sub-channels for other types of bits could also or instead be selected. For example, if a number No of CRC bits are used, then the total number of positions or sub-channels that are selected could be sufficient to accommodate both information bits and CRC bits. In some notations, this could be expressed as K including No positions or sub-channels (that is, K includes both information bits or sub-channels and other bits to be encoded or other sub-channels for such bits, such as CRC bits, PC bits and/or other types of bits). Other notations could express the number of positions or sub-channels as K+No. The former notation is used primarily herein, and is intended to encompass selection of positions or sub-channels that could include information positions or sub-channels and possibly other types of positions or sub-channels.

As another example, if PC polar coding is used, assistant positions or sub-channels could be selected, along with information positions or sub-channels, for a complete set or a subset of PC bits. Positions or sub-channels for PC bits, CRC bits, assistant bits, and/or other types of bits that are to be encoded could be determined together with information bits. In some embodiments, other algorithms or techniques are applied to distinguish between different types of selected positions or sub-channels, to distinguish information positions or sub-channels from assistant positions or sub-channels, for example.

Turning again to FIG. 13 and considering an example of selecting information sub-channels, from the nodes in the local diagram 1330, the nodes and corresponding sub-channels for information bits are selected based on ordering just those nodes or sub-channels instead of the full set of sub-channels. Sub-channels that appear in the partial order above the localized part 1320 are selected as information sub-channels, and sub-channels that appear in the partial order below the localized part are frozen sub-channels.

Sub-channels could be selected as information sub-channels by identifying the information sub-channels or by determining frozen sub-channels and designating or selecting the remaining sub-channels as information sub-channels. Determining information sub-channels and determining frozen sub-channels are equivalent to each other.

Instead of generating an overall partial order structure and a complete ordered sub-channel sequence, according to an embodiment, nodes from the localized area 1320 are determined without considering other parts of the partial order. For example, the nodes or sub-channels of interest could be determined based on a group index number. See FIG. 9 for an example of a partial order with group indices labeled.

For a node i with binary expansion $(i_n, \ldots, i_1)$, the group l in which that node is located is $$l = \left( \sum_{j=1}^{n} i_j \cdot j \right).$$

For example:
 node 8 (1000): 0*1+0*2+0*3+1*4=4→group-4;
 node 5 (0101): 1*1+0*2+1*3+0*4=4→group-4.

For group l, binary expansion $(i_n, \ldots, i_1)$ of its complete set of nodes satisfies:

$$\left\{ (i_n, \ldots, i_1) \,\middle|\, \left( \sum_{j=1}^{n} i_j \cdot j \right) = l \right\},$$

where $i_j \in \{0,1\}$

Figure 25:
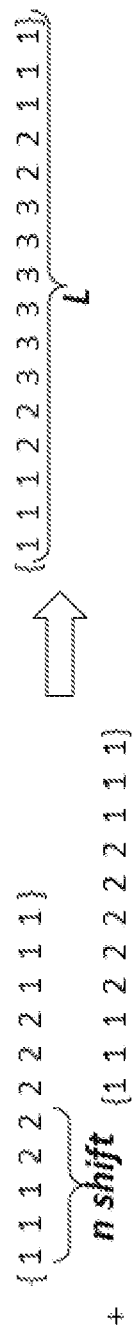
FIG. 25 is a diagram of n-shifted addition of node distributions.

The maximum number of groups: $L=(n^2+n+2)/2$, where $n=\log_2(N)$. The distribution of the number of nodes in each group for N can be computed recursively by n-shifted addition of node distributions for N/2. For example, N=32 can be derived from N=16 as shown in FIG. 25.

In an embodiment, sub-channels are grouped according to binary representations of sub-channel indices, as in the example shown in FIG. 9. The computation complexity associated with grouping sub-channels in this manner is much less than calculating the relative reliabilities of those sub-channels. A localization area might be determined according to coding parameters such as (N, K, R, P) for example. P is a puncturing set representing a number of punctured bits and a puncturing pattern, and is an illustrative example of shortening or puncturing, or more generally rate matching, that could be taken into account in determining a localization area in some embodiments.

Sub-channels in groups with group indices that are above the index of a group at an upper border or boundary of the localization area could be selected as an information bit set $INFO_1$. Sub-channels within the localization area could be ordered, and the number of sub-channels that are needed in addition to the $INFO_1$ sub-channels to meet a target coding rate could be selected as an information bit set $INFO_2$. The method of sub-channel ordering is not limited to PW, DE/GA, and genie-aided, and other methods could be applied, including methods based on offline pre-stored static or online adaptively generated ordered sequence(s). Ordering the sub-channels within the localization area is optional. An information bit set could be directly obtained without knowing the exact order of all the nodes within the localization area, for example with a similar method to an interweaving sequence-based polar code construction method.

The information bit sets $INFO_1$ and $INFO_2$ are combined in this example to generate a final information bit set. As described elsewhere herein, such a selection technique could be applied to select a frozen bit set by selecting least reliable sub-channels. Other types of channels, for PC bits, CRC bits, and/or other types of decoding assistant bits, for example, could be selected in a similar manner.

Figure 14:
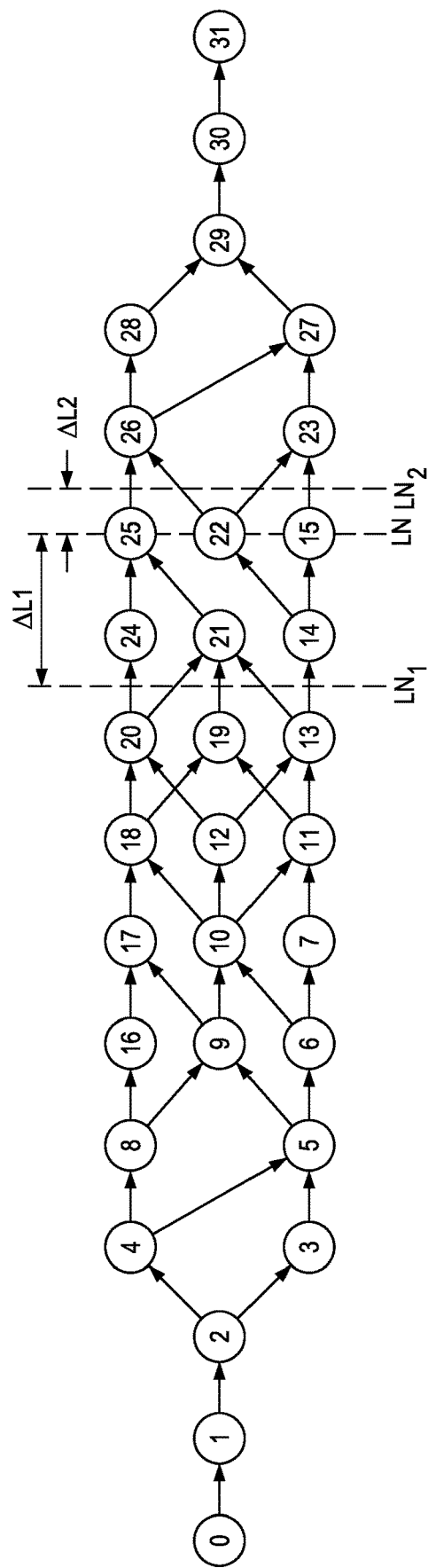
FIG. 14 is a block diagram illustrating a more detailed example of partial-order-based sub-channel ordering according to an embodiment.

FIG. 14 is a block diagram illustrating a more detailed example of partial-order-based sub-channel ordering according to an embodiment. FIG. 14 relates to an example in which N=32. Given an information block length K=10 and code rate R=5/16 for instance, code block length N could be determined to be 32, and $n=\log_2(N)=5$.

FIG. 14 shows a line LN drawn at group $l_1$, so that there are $>=K$ nodes or sub-channels appearing at or above (not below) group $l_1$ in the partial order and <K nodes appearing at or above (not below) group $l_1+1$ in the partial order. Two additional lines, $LN_1$, $LN_2$, are also shown in FIG. 14, and are drawn at $\Delta L1$ and $\Delta L2$ groups away from LN, respectively. Although these lines are shown in FIG. 14 for illustrative purposes, it should be noted that such lines need not physically be drawn in a partial order representation. A boundary satisfying the conditions of line LN could be determined without actually drawing the line LN, and similarly a boundary region or area including $\Delta L1$ and $\Delta L2$ adjacent groups could be determined without actually drawing the lines $LN_1$ and $LN_2$.

The nodes or sub-channels in groups higher than $LN_2$ are selected as information positions or sub-channels. The nodes or sub-channels between $LN_1$ and $LN_2$ are ordered or sorted, based on β in an embodiment, and the nodes or sub-channels with the highest metrics (polynomial values for example) are selected as information positions or sub-channels to make up a total of K information positions or sub-channels. Other nodes or sub-channels are frozen positions in this example.

Regarding ordering of nodes in the localization region between $L_{N1}$ and $LN_2$, such ordering in this example involves nodes {14, 15, 21, 22, 24, 25}. For a binary expansion-based metric function with β=1.189, for example, the ordering is 24+14+21+22+25+15, in increasing order. Thus, the nodes or sub-channels {22,25,15} are selected as information positions or sub-channels, to supplement the selected nodes or sub-channels {23, 26, 27, 28, 29, 30, 31}, in order to provide a total of K=10 information positions or sub-channels.

Figure 15:
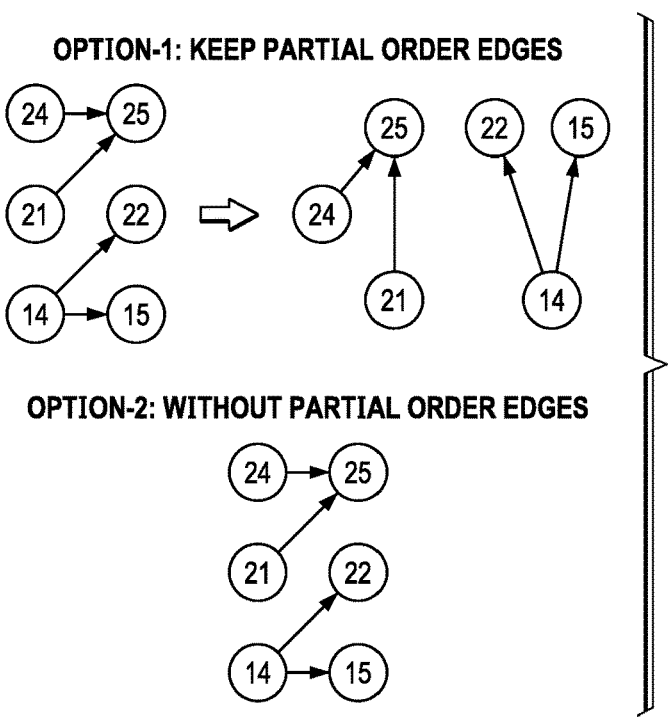
FIG. 15 includes block diagrams illustrating sub-channel selection in a localization area of a partial order.

Ordering or sorting of nodes or sub-channels in a localization area may or may not be based on edges in the partial order. FIG. 15 includes block diagrams illustrating sub-channel selection in a localization area of a partial order.

Considering first the upper diagram in FIG. 15, and the example described with reference to FIG. 14 in which three nodes or sub-channels are selected from a localization area, node 25 could first be compared with node 14. If node 25 has a lower reliability metric than node 14, then it can be concluded that nodes {14, 22, 25} should be ordered higher than node 25 and its lower-ordered nodes 21 and 24, and the sub-channels corresponding to nodes {14, 22, 25} are selected as information sub-channels. Otherwise, node or sub-channel 25 is selected, and a comparison among nodes {24, 21, 22, 15} is performed to identify the other two nodes and sub-channels that are to be selected as information positions or sub-channels.

Without using edges from the partial order, all six nodes are ordered, and the top three are selected. A metric function that avoids conflict with the partial order could be used to calculate metric values to sort the nodes or sub-channels into an order that does not violate the partial order even though the partial order edges are not used in ordering the nodes or sub-channels in this example.

Figure 16:
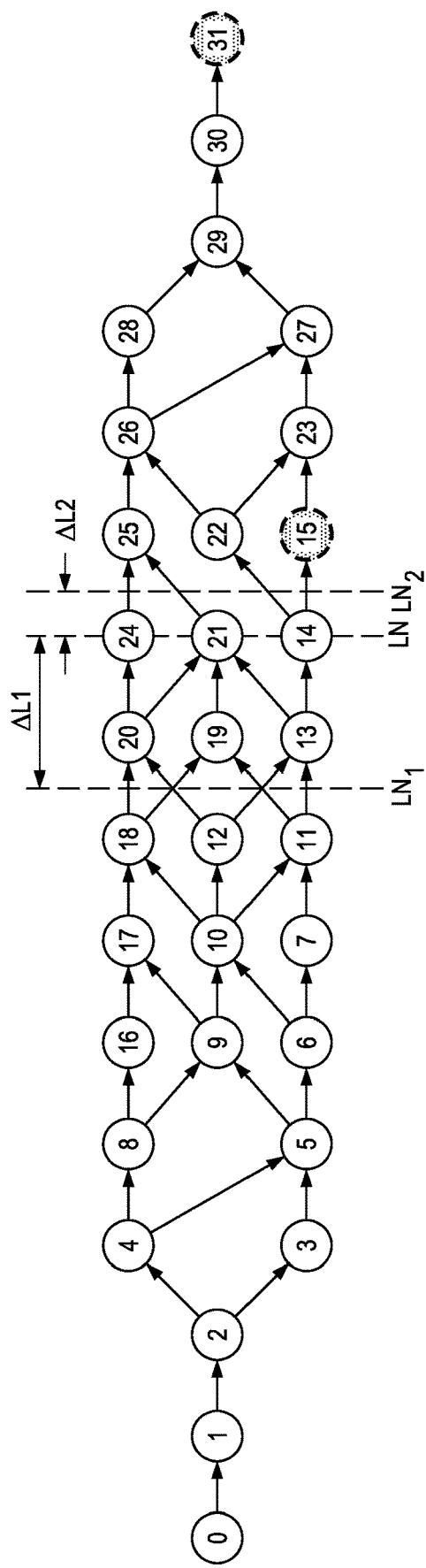
FIG. 16 is a block diagram illustrating another example of partial-order-based sub-channel ordering with shortening/puncturing according to an embodiment.

FIG. 16 is a block diagram illustrating another example of partial-order-based sub-channel ordering with shortening/puncturing according to an embodiment. For the purposes of this example, given an information block length K=10 and rate R=1/3, code block length N can be determined to be 32. The example shown in FIG. 16 illustrates shortening according to a BIV or bit reverse puncturing or shortening method, in which bit positions corresponding to nodes 31 and 15 will be shortened. BIV puncturing/shortening is a rate matching method. In this example, N=32, and 2 bits need to be shortened. The BIV method first marks the number of shortened bits (2 in this example) starting from the highest bit. The binary representations of the bit positions, 11110 and 11111 in this example, are bit reversed (01111, 11111), which gives bits 15 and 31 to be shortened.

FIG. 16 also shows a line LN at group $l_1$, so that there are >=K non-shortened nodes appearing at or above (not below) group $l_1$ in the partial order and <K non-shortened nodes appearing at or above (not below) group $l_1+1$ in the partial order. Two lines, $LN_1$, $LN_2$, are also shown, at $\Delta L1$ and $\Delta L2$ groups away from LN, respectively. As noted above, sub-channel ordering and selection need not involve actually drawing any lines on a representation of a partial order.

Nodes or sub-channels corresponding to non-shortened positions in groups higher than $LN_2$ are selected as information positions or sub-channels. The non-shortened nodes or sub-channels that appear in the localization area or region between $LN_1$ and $LN_2$ are ordered, based on a function of β for example, and the nodes or sub-channels with highest metric values are selected as information positions or sub-channels. The remaining nodes or sub-channels are frozen positions or sub-channels.

In FIG. 16, nodes {13, 14, 19, 21, 20, 24} are to be ordered. When β=1.189, the ordering is 20→24→13→19→14→21. Two nodes or sub-channels {14,21} are selected as information positions or sub-channels, to supplement the eight nodes or sub-channels above the localization area, to provide the K=10 sub-channels.

The example shown in FIG. 16 relates to an embodiment that could be considered a form of group-level or group-resolution localization. For a group-resolution localization area, a vector Group_Sum[i] could be defined as the total number of nodes or sub-channels from group i to group L−1 that are not frozen due to puncturing or shortening. L is the total number of groups including all sub-channels and 0≤i≤L−1. Locating LN could then involve finding the group i where Group_Sum[i+1]<K<=Group_Sum[i], which is equivalent to determining group i so that there are >=K nodes or sub-channels appearing at and above (not below) that group in the partial order and <K nodes appearing at and above (not below) group i+1 in the partial order. The boundaries of the localization area are $\Delta L1$ and $\Delta L2$ groups away from group i, where $\Delta L1$ and $\Delta L2$ are both non-negative integers.

The localization area size or group distance $\Delta L1+\Delta L2+1$, and/or either or both of the values $\Delta L1$ and $\Delta L2$ could be fixed and pre-designed values, or could be determined adaptively as a function of one or more of code length N, information block length K, and rate matching scheme (e.g., a puncturing set P). Other coding parameters could also or instead be used.

Code rate R is a function of K and P in a puncturing/shortening scenario, or in the notation herein R=func(K,P). For adaptive determination of $\Delta L1$ and $\Delta L2$, knowing K and the puncturing set P is equivalent to knowing the coding rate R or equivalently knowing R and P is equivalent to knowing K. $\Delta L1$ and/or $\Delta L2$ could therefore be considered to be related to, and determined on the basis of (K,P) or (R,P). N is also related to the determination of $\Delta L1$ and/or $\Delta L2$.

Determining a localization area could involve finding a group i such that Group_Sum[i+1]<K<=Group_Sum[i], as described above. In one embodiment of adaptive boundary adjustment or adaptive localization area determination, if Group_Sum[$i$]−$K$<$K$−Group_Sum[$i$+1], then
$\Delta L1$>=$\Delta L2$;

otherwise, $\Delta L1$<=$\Delta L2$.

In this example, the Group_Sum[ ] condition could be considered a determination as to which of group i and group i+1 is "closer" to K. It may be preferable to have an equal number of sub-channels above and below the Kth sub-channel from the right end or the highest end of the partial order, for example, in order to minimize the number of groups included in the localization area. The above example condition provides an illustrative example of how localization area boundaries could be determined to equalize or balance, or at least better equalize or balance, the number of sub-channels above and below the Kth sub-channel from the right of the partial order by potentially extending a boundary in one direction more than in another direction depending on whether the condition is satisfied.

Different rate matching schemes and mother block lengths N may result in different boundary settings. The examples in the following table adopt a PW-based method for ordering sub-channels within a localization area, and the coding rates for eMBB control channel, 1/12~2/3, are considered. Block puncturing and block shortening refer to puncturing or shortening of consecutive sub-channels in a natural order or reverse of natural order of sub-channel indices, and BIV shortening is as described above. In the table, "adaptive ($\Delta L1$=1 or 2, $\Delta L2$=1 or 2)" means adaptive boundary determination is adopted, and when the above Group_Sum [ ] condition is satisfied, $\Delta L1$=2, $\Delta L2$=1, while otherwise $\Delta L1$=1, $\Delta L2$=2.

| Rate Matching Scheme | N <= 256 | N = 512 | N = 1024 |
| --- | --- | --- | --- |
| Block Puncturing | Adaptive ($\Delta L1$ = 1 or 2, $\Delta L2$ = 1 or 2) | Pre-fixed ($\Delta L1$ = 2, $\Delta L2$ = 2) | Pre-fixed ($\Delta L1$ = 2, $\Delta L2$ = 3) |
| Block Shortening | Adaptive ($\Delta L1$ = 1 or 2, $\Delta L2$ = 1 or 2) | Adaptive ($\Delta L1$ = 1 or 2, $\Delta L2$ = 1 or 2) | Pre-fixed ($\Delta L1$ = 2, $\Delta L2$ = 2) |

| Rate Matching Scheme | N <= 256 | N = 512 | N = 1024 |
|---|---|---|---|
| BIV Shortening | Adaptive ($\Delta L1$ = 1 or 2, $\Delta L2$ = 1 or 2) | Adaptive ($\Delta L1$ = 1 or 2, $\Delta L2$ = 1 or 2) | Pre-fixed ($\Delta L1$ = 2, $\Delta L2$ = 2) |

In general, $\Delta L1$ and $\Delta L2$ could increase with N, because sub-channels are expected to be more scattered or distributed with increasing mother code length, which may favor a larger localization area.

Figure 17:
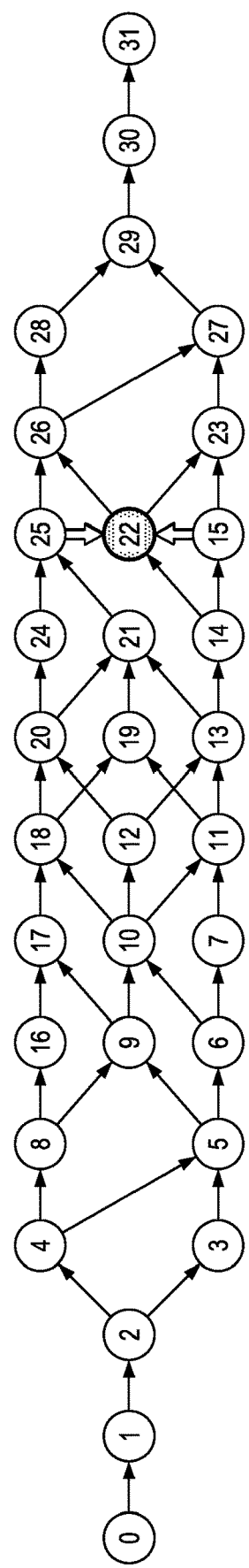
FIG. 17 is a block diagram illustrating an example of sub-channel ordering according to a further embodiment.

FIG. 17 is a block diagram illustrating an example of sub-channel ordering according to a further embodiment, using an example with K=10, R=5/16→N=32, n=5. Although the partial order shown in FIG. 17 is the same as the partial order shown in FIGS. 14 and 16, in an embodiment all nodes or sub-channels in FIG. 17 are sorted not only in group-ascending order in the partial order. Nodes or sub-channels in the same group are also sorted, for example, by Hamming weight function or another metric function as described herein and/or in node-index ascending order within each group. For example, the sorted order for the groups and N=32 partial order shown in FIG. 17, after further per-group sorting according to Hamming weight, is {0, 1, 2, . . . , 24, 14, 21, 22, 25, 15, 26, 23, 28, 27, 29, 30, 31} in an embodiment.

The Kth node from the right of the partial order (denoted as $N_K$) is identified, and nodes within L1 nodes to the left of $N_k$ and L2 nodes to the right of $N_k$ are selected as the localized area, where L1 and L2 are non-negative numbers. In the example of K=10, node 22 in FIG. 17 is selected as $N_{10}$. When L1=2 and L2=2, the localized area includes nodes {14,21,22,25,15}, based on the per-group sort order noted above. When $\beta$=1.189 in a metric function as described herein, the ordering is 14→21→22→25→15, and the right $L_2$+1 nodes or corresponding sub-channels {22,25,15} are selected as information positions or sub-channels. All nodes or sub-channels to the right of the localized area in this example are information nodes or sub-channels, and non-selected nodes or sub-channels are frozen.

In such node-resolution localization, sub-channel indices or nodes within each group are ordered, according to a law or rule, such as a natural number ascending law, a Hamming weight ascending law, and/or based on another metric. The node $N_k$ for which the number of nodes from $N_k$ to the last node (including node $N_k$) is equal to K is determined. The borders or boundaries of the localization area are L1 and L2 nodes away from $N_k$, where L1 and L2 are both non-negative integers.

The localization area size or node distance L1+L2+1, and/or either or both of the values L1 and L2 could be fixed and pre-designed values, or could be determined adaptively as a function of one or more of R, N, K, and a rate matching scheme (e.g., a puncturing set P). Other coding parameters could also or instead be used. As described above for $\Delta L1$ and $\Delta L2$, R=func(K,P). For adaptive determination of L1 and L2, knowing K and the puncturing set P is equivalent to knowing the coding rate R, or equivalently knowing R and P is equivalent to knowing K. L1 and/or L2 could be considered to be related to, and determined on the basis of, any or all of R, K, P and N.

For node-resolution localization, determining a localization area could involve sorting all sub-channels or nodes in the group-ascending order. The nodes in the same group could be sorted first according to Hamming weights in ascending order and then in the node-index ascending order, for example. For N=32, the order is {0, 1, 2, . . . , 24, 14, 21, 22, 25, 15, 26, 23, 28, 27, 29, 30, 31} in an embodiment, as described above. The Kth node from the right of the partial order (denoted as $N_K$) is determined, and then the two non-negative values L1 and L2 are determined, such that nodes within L1 nodes to the left of $N_k$ and L2 nodes to the right of $N_k$ are selected as the localization area. For example, in FIG. 17 node 22 is selected as $N_{10}$. For a scenario with L1=2, L2=2, the localized area includes nodes {14,21,22,25,15}. When $\beta$=1.189, the ordering is 14→21→22→25→15, consistent with an example described above. The leftmost $L_2$+1 nodes {22,25,15} are selected as information nodes, and all the nodes to the right of the localization area are selected as information nodes.

Figure 17A:
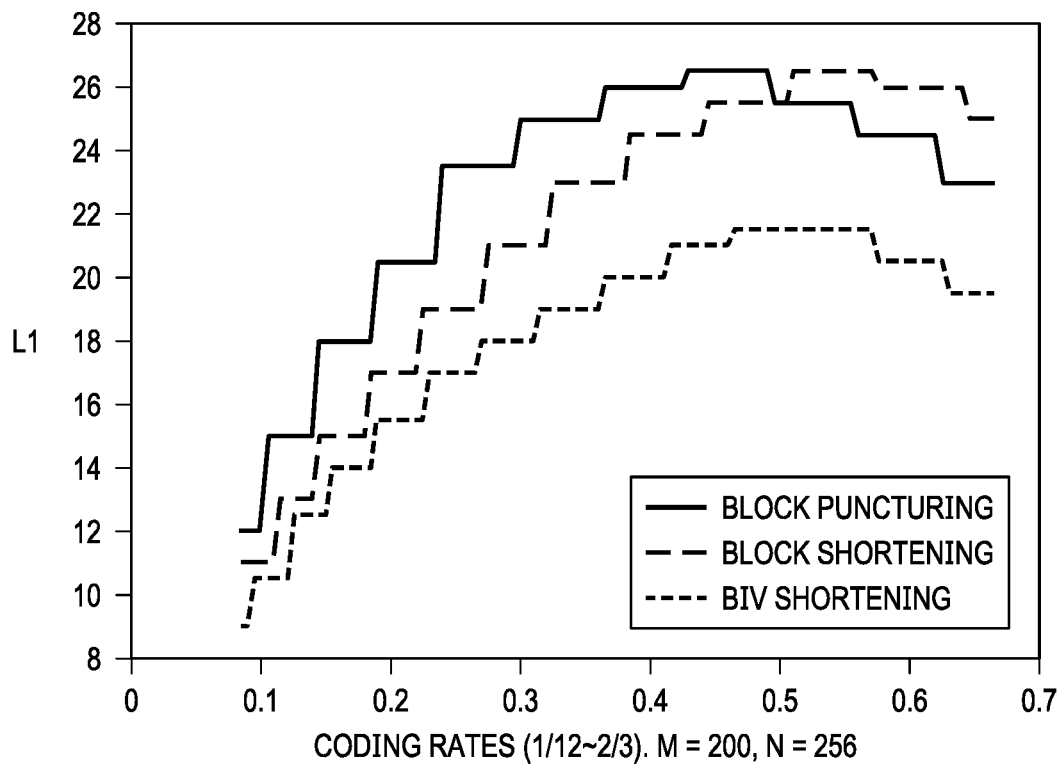
FIG. 17A is an example plot of node-resolution localization parameters L1 and L2 versus coding rate for three different rate matching schemes.

FIG. 17A is an example plot of node-resolution localization parameters L1 and L2 versus coding rate for three different rate matching schemes. Similar or different behavior could be observed under similar or different simulation conditions than the transmitted block length M=200 and N=256 with the coding rates shown in FIG. 17A.

In the example plot in FIG. 17A, L1 and L2 increase with coding rate up to a peak, at approximately R=1/2, and then decrease. This is consistent with the general shape of a partial order. With reference to FIG. 17, the three highest order groups include one node each, the next two groups include two nodes each, the next six groups include three nodes each, the next two groups include two nodes each, and then the last three groups include one node each. The effect of increasing code rate, when N (and a puncturing/shortening pattern if applicable) remains the same, is that more nodes are to be selected and the localization area is shifted to the left. It stands to reason that, as groups become larger to the left in a partial order, a localization area tends to include more nodes. Similarly, based on the structure of a partial order, it would be expected that the number of nodes in a localization area would eventually decrease with continued left shifting of the localization area when smaller groups are encompassed within the localization area.

The node boundaries L1 and L2 could be related to the sizes of the groups around $N_k$, which could include the group of $N_k$ in some embodiments. For example, L1 and L2 could be computed as half of the total group size of a number of groups surrounding the group in which $N_k$ is located. Therefore, in some embodiments, node-resolution localization could involve not only determining $N_k$, but also determining the group i in which $N_k$ is located. In one example, the total number of nodes in the four groups surrounding group i (including group i), namely groups i±1 and i+2 or i−2, could be determined and halved to calculate L1 and L2. Whether to include group i+2 or i−2 may depend on whether the Group_Sum[ ] condition is satisfied or not, for example.

As aforementioned, knowing (K,P) is equivalent to knowing (R,P) when determining the localization area. FIG. 17A shows how L1 and L2 changes adaptively to the coding rate R (1/12≤R≤2/3 for eMBB control channel) for an example code configuration of mother block length N=256 and transmitted block length M=200. L1 is set to be equal to L2, which is calculated as half of the total group size of groups i, i±1, and i+2 or i−2 as described above. Three rate-matching schemes are considered. It is observed that with the example (N,M), BIV shortening gives the smallest value of L1 compared with block-based puncturing/shortening. This indicates that BIV shortening could generally include the smallest number of sub-channels in the localization area while keeping the BLER performance un-degraded.

This type of node-level boundary or node-resolution localization may provide more flexibility in selecting nodes or sub-channels in a localization area. Within one group, some nodes could be identified for inclusion within a localization area while others might not. This potential advantage may be or become more important when N increases and one group includes more nodes. Instead of or in addition to the per-group Hamming weight and/or index sort noted above, different sorting algorithms could be used to sort the nodes within each group. However, a per-group sort involves extra computational complexity for sorting the nodes in each same group.

The examples described above with reference to FIGS. 14,16, and 17 use sorting in the localization areas with $\beta=1.189=2^{1/4}$. $\beta$ could be fixed to this value or another value stored in memory, for example. $\beta$ could instead be adaptively determined according to SNR, block length N, and/or other coding parameters, such as by using a lookup table as noted above. Other metric functions could be used in other embodiments.

In general, according to aspects of the present disclosure, certain sub-channels are allocated or selected as information sub-channels and frozen sub-channels. A sub-channel allocation pattern may be determined or established as a function of {K, N} where K is the number of information sub-channels or information block length for encoding, and N is the code length. Typically, both an encoder and a decoder will produce or use the same sub-channel allocation pattern so that the encoded information can be properly decoded.

Figure 18A:
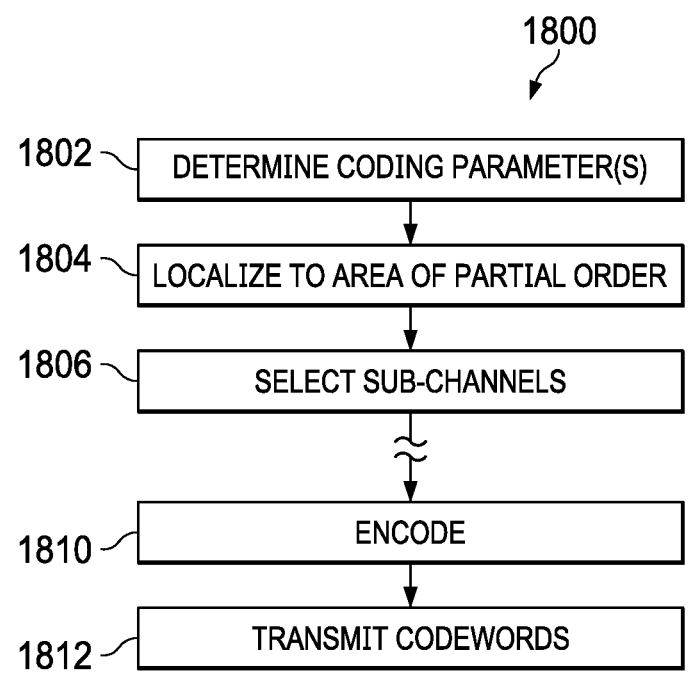
FIG. 18A is a flow diagram of an example coding method according to another embodiment.

FIG. 18A is a flow diagram of an example coding method according to another embodiment. The illustrated example method 1800 includes determining one or more coding parameters at 1802. The coding parameter(s) could include at least K and N, which could be read from memory or otherwise provided. Several examples above refer to computing N and n based on a given K and a given code rate R. Given one of K and R, and given one of N and n, the others of these coding parameters can be computed based on R=K/N and N=$2^n$. The puncturing/shortening pattern P could similarly be determined, in embodiments that involve rate matching, where P indicates how many and which coded bits are punctured/shortened.

From N sub-channels that are defined by a code and that have associated reliabilities for input bits at N input bit positions, K of the sub-channels to carry bits that are to be encoded is determined at 1802. SNR, $\alpha$, $\Delta$L1, $\Delta$L2, L1, and L2 are all examples of additional coding parameters that could be read from memory or otherwise determined at 1802, or as needed during the example method 1800, for localization at 1804 or optionally determining sub-channel order, for example.

At 1804, sub-channel sorting or ordering can be localized to a particular area or region of a partial order. Several examples of localization procedures that could be applied at 1804 to identify a localization area or region, or the nodes or sub-channels that are to be considered for sorting or ordering, are described herein.

Optionally, an order of the sub-channels in the localization area could be determined. It should be noted that this order need not necessarily sort every node or sub-channel in a localization area, as described above with reference to the upper diagram in FIG. 15, for example. As indicated above, the localized ordering could be used for a variety of purposes including to complete the selection of a set K of sub-channels with the highest reliability (e.g., for information bits) or a set of N−K sub-channels with the lowest reliability (e.g., for frozen bits). Alternatively, localized ordering could be used to order and/or select a particular set of sub-channels of interest (e.g., sub-channels for assistant bits) among N sub-channels.

Sub-channels are selected at 1806. Although only one sub-channel selection operation is shown in FIG. 18A, embodiments could include multiple selection operations (e.g., for different types of input bits such as information bits, frozen bits, and/or assistant bits). For example, fewer than K sub-channels of the N sub-channels could be selected based on the partial order, in which reliabilities of at least some of N sub-channels relative to each other are independent of a transmission model. This is described herein by way of example as selecting nodes or sub-channels that appear above or higher than the localization area in the partial order as information positions or sub-channels. A number of sub-channels are also selected from the next most reliable sub-channels of the N sub-channels in the partial order, based on a transmission model dependent function. This is described herein by way of example as selecting additional nodes or sub-channels from the localization region. The selected most reliable sub-channels (above the localization area) and the selected next most reliable sub-channels (within the localization area) include, in total, K sub-channels to carry the bits that are to be encoded.

At some time after the K sub-channels have been selected, input bits that are to be encoded onto the K selected sub-channels are encoded at 1810 to generate codewords. The codewords are then transmitted at 1812.

The example method in FIG. 18A is intended for illustrative purposes. Other embodiments could involve performing the illustrated operations in any of various ways, performing fewer or additional operations, and/or varying the order in which operations are performed.

Figure 18B:
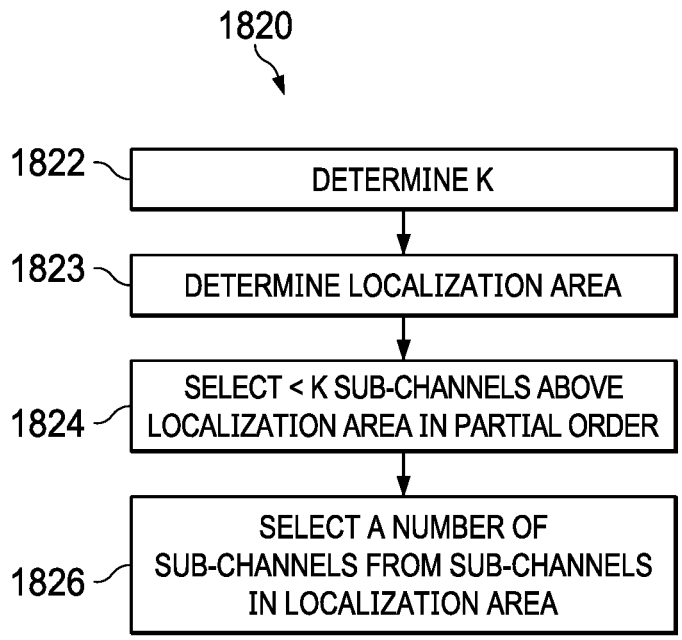
FIG. 18B is a flow diagram of an example coding method according to a further embodiment.

FIG. 18B, for example, is a flow diagram of an example coding method according to a further embodiment. The method 1820 involves determining at 1822, from N sub-channels that are defined by a code and that have associated reliabilities for input bits at N input bit positions, a number K of the sub-channels to carry bits that are to be encoded. This is an example of an operation that could be performed at 1802 in FIG. 18A.

Based on one or more coding parameters, a localization area is determined at 1823. The localization area includes multiple sub-channels and is located below fewer than K of the N sub-channels in a partial order of the N sub-channels.

As described above, although reliability might generally increase with each group from left to right in a partial order such as shown in FIG. 9, the nodes in each group or the sub-channels corresponding to those nodes need not necessarily all have higher reliabilities than all of the nodes or corresponding sub-channels in a preceding group that is lower in the partial order. However, each group in the example shown in FIG. 9 does include one or more nodes representing sub-channel(s) having a higher reliability than a sub-channel represented by a node in a preceding group. Similarly, each group in the example shown in FIG. 9 includes one or more nodes representing sub-channel(s)

having a lower reliability than at least one sub-channel represented by a node in a next higher group in the partial order. In this sense, each node at any group has a relative reliability rank or order with respect to at least one node in an adjacent group.

Group index represents one parameter based upon which a localization area could be considered to be below (or above) other sub-channels in a partial order. In the case of a generally increasing reliability partial order as shown in FIG. 9, for example, a localization area is below sub-channels or nodes that are in groups in the partial order that have a higher group index than a highest-index group that is included in the localization area. Similarly, the sub-channels or nodes that are in groups in the partial order that have a higher group index than a highest-index group in the localization area are above the localization area in the partial order. Group index could similarly be used to determine which groups, nodes, and sub-channels are below a localization area, in either a generally increasing reliability partial order or a generally decreasing reliability partial order.

Characterization of group, node, or sub-channel position in a partial order need not necessarily be tied to group index. Groups, nodes, or sub-channels to the right of a localization area in a generally increasing reliability partial order are above the localization area, and similarly those to the left of the localization area in such a partial order are below the localization area. These definitions would be reversed in a partial order that is in order of generally decreasing reliability.

For node resolution embodiments, some of the nodes in a group could be in a localization area, while others are not. Nodes that are not included in the localization area could therefore have the same group index as a highest-index group in the localization area. Thus, for node resolution embodiments, nodes with higher group indices than the highest-index group in the localization area are above the localization area. In addition, nodes having the same group index as the highest-index group in the localization area and a higher group pre-sorting metric (e.g., natural order or other metric(s)) than same-group nodes that are within the localization area are also above the localization area. Similar definitions could be applied to nodes or sub-channels that are below a localization area and/or to partial orders that are organized in generally decreasing reliability order.

Turning again to FIG. 18B, the fewer than K sub-channels of the N sub-channels that are above the localization area in the partial order are selected at 1824. At 1826, a number of sub-channels from those in the localization area are selected. The operations at 1824, 1826 are examples of operations that could be performed at 1806 in FIG. 18A. The sub-channels that are selected at 1824 and the sub-channels that are selected at 1826 constitute K sub-channels to carry the bits that are to be encoded.

Figure 18C:
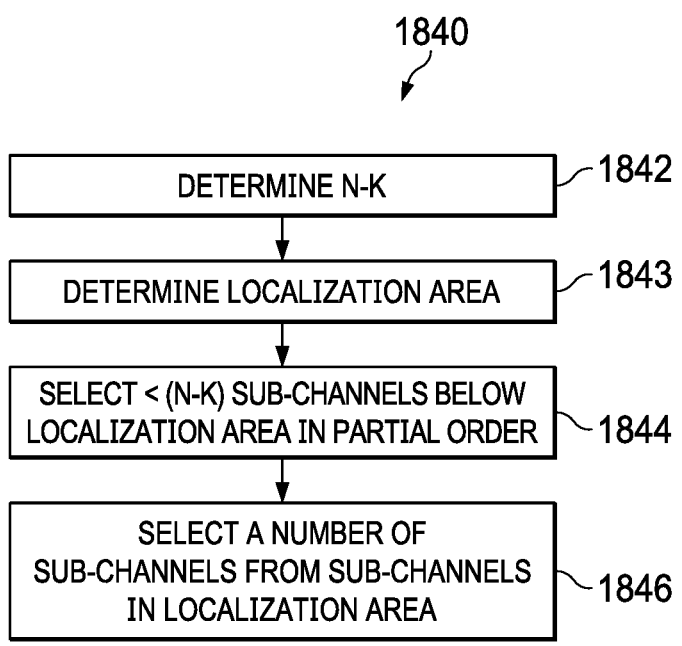
FIG. 18C is a flow diagram of an example coding method according to yet another embodiment.

FIG. 18C is a flow diagram of an example coding method according to yet another embodiment. The method 1840 involves determining at 1842, from N sub-channels that are defined by a code and that have associated reliabilities for input bits at N input bit positions, a number (N−K) of the sub-channels that are not to carry bits that are to be encoded (e.g., frozen sub-channels). This is an example of an operation that could be performed at 1802 in FIG. 18A.

Based on one or more coding parameters, a localization area is determined at 1843. The localization area includes multiple sub-channels and is located above fewer than (N−K) of the N sub-channels in a partial order of the N sub-channels.

The fewer than (N−K) sub-channels of the N sub-channels that are below the localization area in the partial order are selected at 1844. At 1846, a number of sub-channels from those in the localization area are selected. The operations at 1844, 1846 are examples of operations that could be performed at 1806 in FIG. 18A. The sub-channels that are selected at 1844 and the sub-channels that are selected at 1846 constitute (N−K) sub-channels that are not to carry the bits that are to be encoded.

Figure 18D:
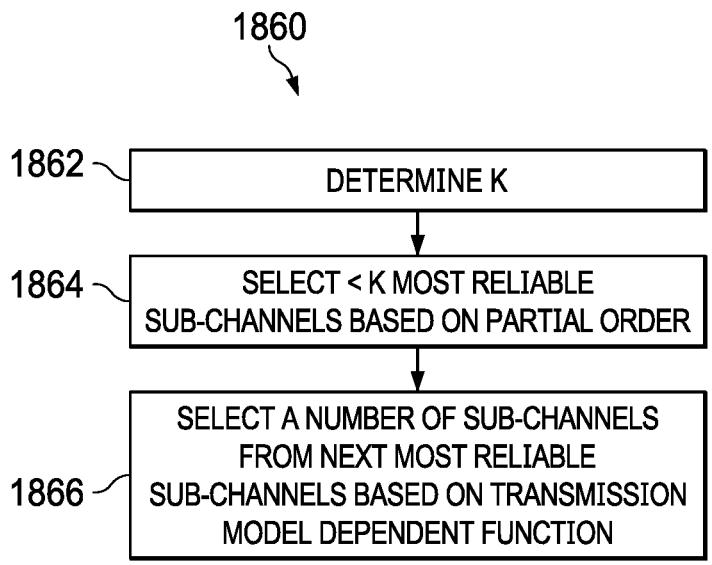
FIG. 18D is a flow diagram of an example coding method according to yet another embodiment.

FIG. 18D is a flow diagram of an example coding method according to a further embodiment. The method 1860 involves determining at 1862, from N sub-channels that are defined by a code and that have associated reliabilities for input bits at N input bit positions, a number K of the sub-channels to carry bits that are to be encoded. This is an example of an operation that could be performed at 1802 in FIG. 18A. Fewer than K most reliable sub-channels of the N sub-channels are selected at 1864 based on a partial order of the N sub-channels in which reliabilities of at least some of N sub-channels relative to each other are independent of a transmission model. At 1866, a number of sub-channels from next most reliable sub-channels of the N sub-channels in the partial order are selected, based on a transmission model dependent function. The operations at 1864, 1866 are examples of operations that could be performed at 1806 in FIG. 18A. The selected most reliable sub-channels that are selected at 1864 and the selected next most reliable sub-channels that are selected at 1866 constitute K sub-channels to carry the bits that are to be encoded.

Figure 18E:
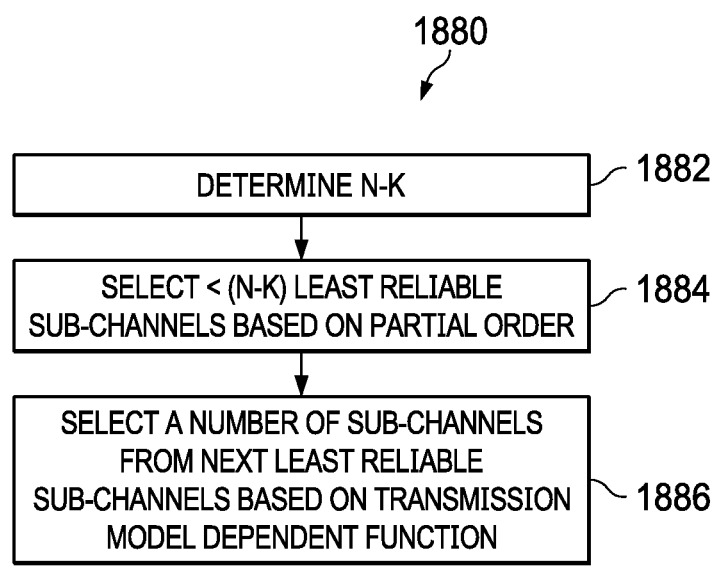
FIG. 18E is a flow diagram of an example coding method according to yet another embodiment.

FIG. 18E is a flow diagram of an example coding method according to yet another embodiment. The method 1880 involves determining at 1882, from N sub-channels that are defined by a code and that have associated reliabilities for input bits at N input bit positions, a number (N−K) of the sub-channels that are not to carry bits that are to be encoded (e.g., frozen sub-channels). This is an example of an operation that could be performed at 1802 in FIG. 18A. Fewer than (N−K) least reliable sub-channels of the N sub-channels are selected at 1884 based on a partial order of the N sub-channels in which reliabilities of at least some of N sub-channels relative to each other are independent of a transmission model. At 1886, a number of sub-channels from next least reliable sub-channels of the N sub-channels in the partial order are selected, based on a transmission model dependent function. The operations at 1884, 1886 are examples of operations that could be performed at 18o6 in FIG. 18A. The selected least reliable sub-channels that are selected at 1884 and the selected next least reliable sub-channels that are selected at 1886 constitute (N−K) sub-channels that are not to carry the bits that are to be encoded.

FIGS. 18B, 18C, 18D, and 18E illustrate that selection of sub-channels to carry bits that are to be encoded (e.g., information sub-channels) is equivalent to selection of sub-channels that are not to carry bits that are to be encoded (e.g., frozen sub-channels). The techniques disclosed herein could be used in selecting information sub-channels, for example, or to select frozen sub-channels and then allocate or otherwise select other sub-channels as information sub-channels, for example.

Other variations could be or become apparent to a skilled person based on the present disclosure.

For example, any one or more of the following could be provided, alone or in any of various combinations, in embodiments:

the one or more coding parameters includes any one or more of: code rate, mother code block length N, code block length M, information block length K, rate matching scheme, and SNR;

the partial order includes a plurality of groups of sub-channels including respective subsets of the N sub-channels;

determining a group of the plurality of groups to which a Kth sub-channel from a highest end of the partial order belongs, and determining the localization area as a number of groups adjacent to and including the group to which the Kth sub-channel from the highest end of the partial order belongs;

determining the localization area involves determining a first number of adjacent groups in the partial order above the group to which the Kth sub-channel from the highest end of the partial order belongs and a second number of adjacent groups in the partial order below the group to which the Kth sub-channel from the highest end of the partial order belongs;

determining the first number of adjacent groups and the second number of adjacent groups involves:

if Group_Sum[$i$]−$K$<$K$−Group_Sum[$i$+1], then $\Delta L1 \geq \Delta L2$;

otherwise, $\Delta L1 \leq \Delta L2$, where Group_Sum[$i$] represents the total number of sub-channels in group i to group L−1 (0≤i≤L−1), L is the total number of groups including all of the N sub-channels, $\Delta L1$ is the first number of adjacent groups, and $\Delta L2$ is the second number of adjacent groups;

determining the localization area involves determining the localization area as a number of sub-channels adjacent to and including a Kth sub-channel from a highest end of the partial order;

determining the localization area involves determining a first number of adjacent nodes in the partial order above the Kth sub-channel from the highest end of the partial order and a second number of adjacent nodes in the partial order below the Kth sub-channel from the highest end of the partial order;

the partial order includes a plurality of groups of sub-channels including respective subsets of the N sub-channels, and the method also involves determining a group of the plurality of groups to which the Kth sub-channel from the highest end of the partial order belongs; and determining a total number of sub-channels in the localization area based on numbers of sub-channels in groups adjacent to the group to which the Kth sub-channel from the highest end of the partial order belongs;

determining the group to which the Kth sub-channel from the highest end of the partial order belongs involves determining an ith group of the plurality of groups, for which Group_Sum[$i$+1]<$K$≤Group_Sum[$i$], where Group_Sum[$i$] represents a total number of sub-channels in group i to group L−1 (0≤i≤L−1), and L is the total number of groups including all of the N sub-channels;

grouping the sub-channels into the plurality of groups based on a binary expansion ($i_n$, . . . , $i_1$) of an index of each of the N sub-channels according to $$\left(\sum_{j=1}^{n} i_j \cdot j\right) = l,$$

Where $i_j \in \{0,1\}$, and l comprises an index of each group of the plurality of groups;

selecting a number of sub-channels from the plurality of sub-channels in the localization area involves selecting the number of sub-channels according to an order of the plurality of sub-channels in the localization area—in other embodiments a complete order of the sub-channels in the localization area is not used, and sub-channels are selected from the localization area without knowing the exact ordering;

the order is determined based on one or more metrics associated with the sub-channels;

sorting the sub-channels in each group of sub-channels that includes at least one sub-channel in the localization area, according to metrics associated with the sub-channels; identifying sub-channels for the localization area based on a sort order of the sub-channels;

the N sub-channels include sub-channels corresponding to bit positions that are frozen due to puncturing or shortening, and the selecting operations involve selecting sub-channels corresponding to bit positions that are not frozen due to puncturing or shortening;

K comprises a number of information bit positions that are to be encoded, and N−K comprises a number of frozen bit positions;

encoding the bits that are to be encoded onto the K selected sub-channels to generate codewords;

transmitting the codewords;

determining a second localization area for selection of sub-channels to carry further bits that are to be encoded—for example, a method could be repeated for different bits that are to be encoded or decoded;

the second localization area includes a different number of the N sub-channels than the localization area—localization area determination could be adaptive, and localization areas could be of different sizes; similarly, localization areas could also or instead be at different positions in a partial order;

the second localization area is determined responsive to a change in a coding parameter of the one or more coding parameters—a localization area could change when a coding parameter that was previously used in determining a localization area changes;

determining the second localization area comprises determining the second localization area based on a coding parameter other than the one or more coding parameters—determination of a new localization area could be based, partially or entirely, on one or more coding parameters other than the coding parameter(s) previously used to determine a localization area.

As another example, any one or more of the following could be provided, alone or in any of various combinations, in embodiments:

a total number of the most reliable sub-channels and the next most reliable sub-channels is greater than K;

selecting a number of sub-channels from the next most reliable sub-channels involves selecting the number of sub-channels according to an order of the next most reliable sub-channels that is based on the transmission model dependent function;

the next most reliable sub-channels comprise a boundary subset in the partial order, above which a total number of sub-channels in the partial order is less than K and with a total number of sub-channels in the boundary subset and above the boundary subset in the partial order being greater than K (a boundary subset is an example of next most reliable sub-channels and a localization area as referenced herein, and FIGS. 13, 14, 16, and 17 illustrate examples of how a boundary subset could be determined or delineated—in other embodiments a boundary subset could be defined in some other manner than based on groups in the partial order);

determining the order of the sub-channels in the boundary subset based on the transmission model dependent function;

identifying the sub-channels in the boundary subset based on a binary expansion $(i_n, \ldots, i_1)$ of sub-channel indices i and a condition $$\left\{(i_n, \ldots, i_1) \left| \left(\sum_{j=1}^{n} i_j \cdot j\right) = l\right.\right\},$$

where $i_j \in \{0,1\}$, where l is an index of each of one or more groups of sub-channels in the boundary subset;

the order is determined by comparing metrics associated with the next most reliable sub-channels based on the partial order;

$N=2^n$;

the transmission model dependent function is a function of SNR, an index of the sub-channel, and n;

the transmission model dependent function yields no conflict with the partial order and sufficient resolution to order the sub-channels in the identified region;

the transmission model dependent function comprises, for each sub-channel of index i, $$\text{metric} = \sum_{j=1}^{n} i_j \beta^{j-1},$$

where the index i has a binary expansion $(i_n, \ldots, i_1)$, $\beta = g(SNR, n)$, and $|\beta| > 1$;

the N sub-channels include sub-channels corresponding to bit positions that are frozen due to puncturing or shortening;

sub-channel selection involves selecting sub-channels corresponding to bit positions that are not frozen due to puncturing or shortening;

K is a number of information bit positions that are to be encoded, and N−K is a number of frozen bit positions;

encoding the bits that are to be encoded onto the K selected sub-channels to generate codewords;

transmitting the codewords.

Also, as noted above, selection of information sub-channels is equivalent to selection of frozen sub-channels, and therefore selection of information sub-channels could involve selection of frozen sub-channels and designating or allocating other sub-channels as information channels.

Although FIG. 18A shows example operations 1810, 1812 that would be performed at an encoder/transmitter, other embodiments could be implemented at a receiver/decoder. A word that is based on a codeword of a code could be received at a receiver and decoded, based on sub-channels that are selected by the decoder or a sub-channel selector coupled to the decoder according to a method as shown at 1802 to 1806 (FIG. 18A), 1822 to 1826 (FIG. 18B), 1842 to 1846 (FIG. 18C), 1862 to 1866 (FIG. 18D), 1882 to 1886 (FIG. 18E), and/or as otherwise disclosed herein.

In another embodiment, a non-transitory processor-readable medium stores instructions which, when executed by one or more processors, cause the one or more processors to perform a method as disclosed herein.

Figure 19:
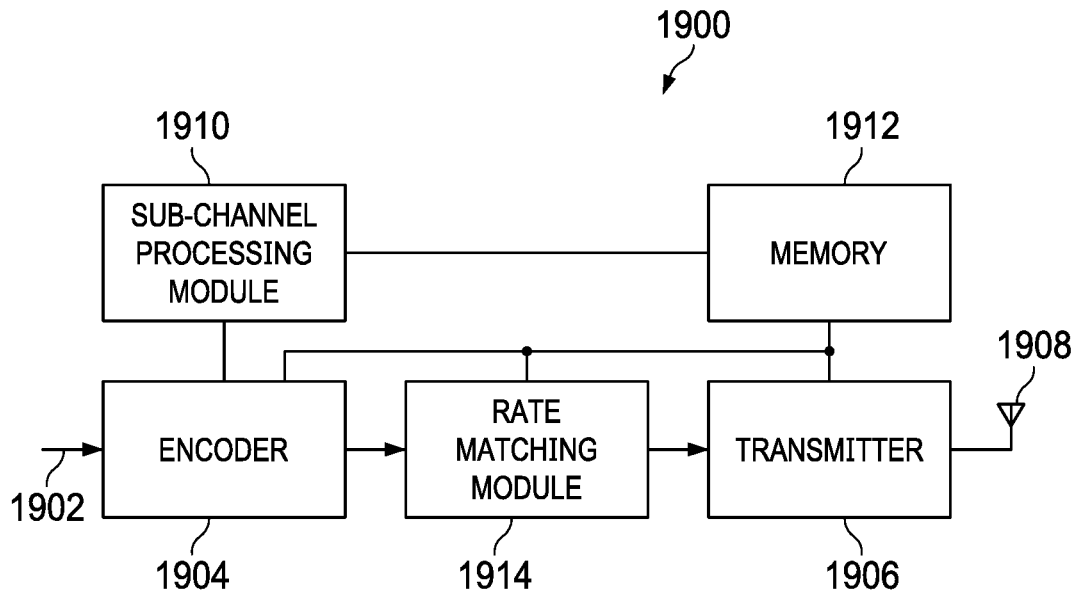
FIG. 19 is a block diagram of an apparatus for encoding and transmitting codewords.

FIG. 19 is a block diagram of an example apparatus for encoding and transmitting codewords. The apparatus 1900 includes an encoder 1904 coupled to a transmitter 1906. The apparatus 1900 also includes a sub-channel processing module 1910 and a rate matching module 1914 coupled to the encoder 1904 and to the sub-channel processing module 1910. In the illustrated embodiment, the apparatus 1900 also includes an antenna 1908, coupled to the transmitter 1906, for transmitting signals over a wireless channel, and an input 1902 for receiving input bits. The transmitter 1906 is also coupled to the rate matching module 1914. In some embodiments, the transmitter 1906 includes a modulator, an amplifier, and/or other components of a radio frequency (RF) transmit chain. A memory 1912 is also shown in FIG. 19, coupled to the encoder 1904, to the sub-channel processing module 1910, to the rate matching module 1914, and to the transmitter 1906.

The encoder 1904 is implemented in circuitry, such as a processor, that is configured to encode input bits as disclosed herein. In a processor-based implementation of the encoder 1904, processor-executable instructions to configure a processor to perform encoding operations are stored in a non-transitory processor-readable medium. The non-transitory medium could include, in the memory 1912 for example, one or more solid-state memory devices and/or memory devices with movable and possibly removable storage media.

The sub-channel processing module 1910 could be implemented in circuitry that is configured to select sub-channels as disclosed herein, and could be implemented using a processor. The same processor or other circuitry, or separate processors or circuitry, could be used to implement both the encoder 1904 and the sub-channel processing module 1910. As noted above for the encoder 1904, in a processor-based implementation of the sub-channel processing module 1910, processor-executable instructions to configure a processor to perform sub-channel processing operations are stored in a non-transitory processor-readable medium, in the memory 1912 for example.

Like the encoder 1904 and the sub-channel processing module 1910, the rate matching module 1914 is implemented in circuitry, such as a processor, that is configured to perform rate matching operations. These rate matching operations could include puncturing/shortening as disclosed herein, for example. In a processor-based implementation of the rate matching module 1914, processor-executable instructions to configure a processor to perform rate matching operations are stored in a non-transitory processor-readable medium, examples of which are described above. In an embodiment, information indicative of bit positions and/or sub-channels that are affected by rate matching, or information from which such bit positions or sub-channels may be determined, may be fed back to the sub-channel processing module 1910, stored to the memory 1912, or otherwise made available to the sub-channel processing module 1910 by the rate matching module 1914. This enables the sub-channel processing module 1910 to determine the bit positions or sub-channels that are affected by rate matching.

The sub-channel processing module 1910 is configured to determine, from N sub-channels that are defined by a code and that have associated reliabilities for input bits at N input bit positions, a number K of the sub-channels to carry bits that are to be encoded. The sub-channel processing module 1910 is further configured to determine, based on one or more coding parameters, a localization area that includes a plurality of the N sub-channels and is located below fewer than K of the N sub-channels in a partial order of the N sub-channels, to select the fewer than K sub-channels of the N sub-channels above the localization area in the partial order, and to select a number of sub-channels from the plurality of sub-channels in the localization area. The selected fewer than K sub-channels and the number of sub-channels selected from the plurality of sub-channels in the localization area comprise K sub-channels to carry the bits that are to be encoded. Information representing the selected sub-channels could be provided to the encoder 1904 for use in encoding input bits, and/or stored in the memory 1912 for subsequent use by the encoder.

The apparatus 1900 could implement any of various other features that are disclosed herein. For example, the encoder 1904, the transmitter 1906, the sub-channel processing module 1910, and/or the rate matching module 1914 could be configured to implement any one or more of the features listed or otherwise described herein, including but not limited to any one or more of the following, alone or in any of various combinations, in embodiments:

the one or more coding parameters comprise any one or more of: code rate, mother code block length N, code block length M, information block length K, rate matching scheme, and SNR;

the partial order comprises a plurality of groups of sub-channels comprising respective subsets of the N sub-channels;

the sub-channel processing module is further configured to determine a group of the plurality of groups to which a Kth sub-channel from a highest end of the partial order belongs;

the sub-channel processing module is further configured to determine the localization area as a number of groups adjacent to and including the group to which the Kth sub-channel from the highest end of the partial order belongs;

the sub-channel processing module is configured to determine the localization area by determining a first number of adjacent groups in the partial order above the group to which the Kth sub-channel from the highest end of the partial order belongs and a second number of adjacent groups in the partial order below the group to which the Kth sub-channel from the highest end of the partial order belongs;

the sub-channel processing module is configured to determine the first number of adjacent groups and the second number of adjacent groups according to:

if Group_Sum[$i$]−K<K−Group_Sum[$i+1$], then
$\Delta L1 >= \Delta L2$;

otherwise, $\Delta L1 <= \Delta L2$, where Group_Sum[i] represents the total number of sub-channels in group i to group L−1 (0≤i≤L−1), L is the total number of groups including all of the N sub-channels, ΔL1 is the first number of adjacent groups, and ΔL2 is the second number of adjacent groups;

the sub-channel processing module is configured to determine the localization area by determining the localization area as a number of sub-channels adjacent to and including a Kth sub-channel from a highest end of the partial order;

the sub-channel processing module is configured to determine the localization area by determining a first number of adjacent nodes in the partial order above the Kth sub-channel from the highest end of the partial order and a second number of adjacent nodes in the partial order below the Kth sub-channel from the highest end of the partial order;

the partial order comprises a plurality of groups of sub-channels comprising respective subsets of the N sub-channels;

the sub-channel processing module is further configured to determine a group of the plurality of groups to which the Kth sub-channel from the highest end of the partial order belongs;

the sub-channel processing module is further configured to determine a total number of sub-channels in the localization area based on numbers of sub-channels in groups adjacent to the group to which the Kth sub-channel from the highest end of the partial order belongs;

the sub-channel processing module is configured to determine the group to which the Kth sub-channel from the highest end of the partial order belongs by determining an ith group of the plurality of groups, for which Group_Sum[$i+1$]<K<=Group_Sum[$i$], where Group_Sum[i] represents a total number of sub-channels in group i to group L−1 (0≤i≤L−1), and L is the total number of groups including all of the N sub-channels; the sub-channel processing module is further configured to group the sub-channels into the plurality of groups based on a binary expansion ($i_n, \ldots, i_1$) of an index of each of the N sub-channels according to $$\left(\sum_{j=1}^{n} i_j \cdot j\right) = l,$$

where $i_j \in \{0,1\}$, and l comprises an index of each group of the plurality of groups;

the sub-channel processing module is configured to select a number of sub-channels from the plurality of sub-channels in the localization area by selecting the number of sub-channels according to an order of the plurality of sub-channels in the localization area;

the order is determined based on one or more metrics associated with the sub-channels;

the sub-channel processing module is further configured to sort the sub-channels in each group of sub-channels that includes at least one sub-channel in the localization area, according to metrics associated with the sub-channels;

the sub-channel processing module is further configured to identify sub-channels for the localization area based on a sort order of the sub-channels;

the N sub-channels comprise sub-channels corresponding to bit positions that are frozen due to puncturing or shortening;

the sub-channel processing module is configured to select sub-channels corresponding to bit positions that are not frozen due to puncturing or shortening;

K comprises a number of information bit positions that are to be encoded, and N−K comprises a number of frozen bit positions;

the encoder is configured to encode the bits that are to be encoded onto the K selected sub-channels to generate codewords;

the apparatus further comprises a transmitter, coupled to the encoder, to transmit the codewords;

the sub-channel processing module is further configured to determine a second localization area for selection of sub-channels to carry further bits that are to be encoded—for example, localization area determination could be repeated for different bits that are to be encoded or decoded;

the second localization area includes a different number of the N sub-channels than the localization area—localization area determination could be adaptive, and localization areas could be of different sizes; similarly, localization areas could also or instead be at different positions in a partial order;

the second localization area is determined responsive to a change in a coding parameter of the one or more coding parameters—a localization area could change when a coding parameter that was previously used in determining a localization area changes;

the sub-channel processing module is configured to determine the second localization area based on a coding parameter other than the one or more coding parameters—determination of a new localization area could be based, partially or entirely, on one or more coding parameters other than the coding parameter(s) previously used to determine a localization area.

In some embodiments, the functionality of the encoder 1904, the transmitter 1906, the sub-channel processing module 1910, and/or the rate matching module 1914 described herein may be fully or partially implemented in software or modules, for example in encoding and transmitting modules stored in a memory such as the memory 1912 and executed by one or more processors of the apparatus 1900.

An apparatus could therefore include a processor, and a memory coupled to the processor storing instructions which, when executed by the processor, cause the processor to perform a method as disclosed herein. In the embodiment shown in FIG. 19, the apparatus 1900 includes the memory 1912, and the sub-channel processing module 1910, which is coupled to the memory 1912, could be configured to perform operations in accordance with embodiments disclosed herein.

Figure 20:
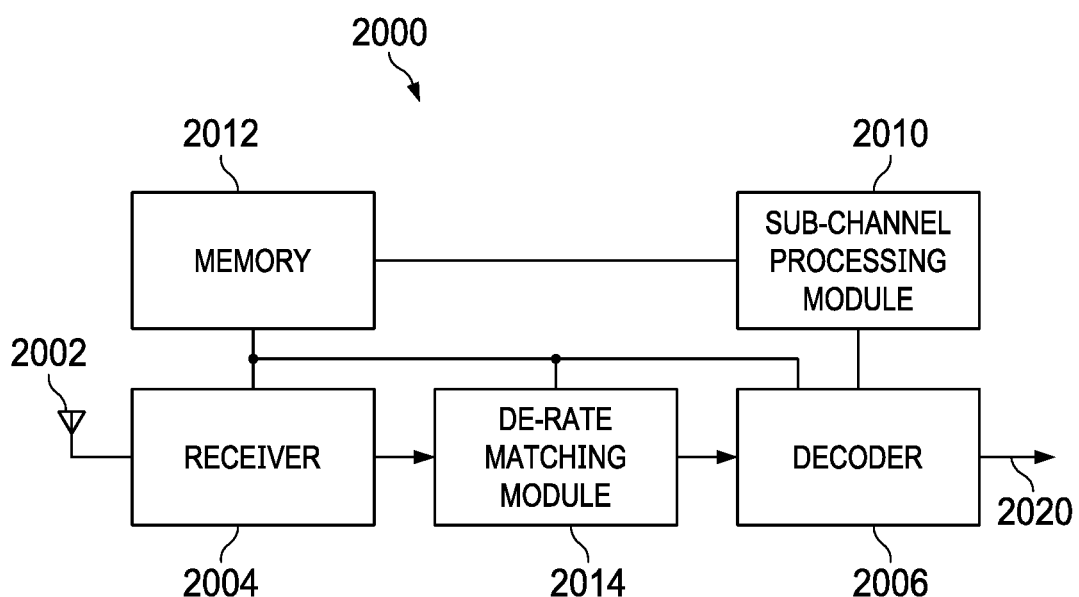
FIG. 20 is a block diagram of an apparatus for receiving and decoding codewords.

FIG. 20 is a block diagram of an example apparatus for receiving and decoding codewords. The apparatus 2000 includes a receiver 2004 coupled to an antenna 2002 for receiving signals from a wireless channel, and to a decoder 2006. The apparatus 2000 also includes a sub-channel processing module 2010 and a de-rate matching module 2014 coupled to the decoder 2006 and to the sub-channel processing module 2010. A memory 2012 is also shown in FIG. 20, coupled to the decoder 2006, to the sub-channel selector 2010, and to the receiver 2004, and to the de-rate matching module 2014. The receiver 2004 is also coupled to the de-rate matching module 2014.

In some embodiments, the receiver 2004 includes a demodulator, an amplifier, and/or other components of an RF receive chain. The receiver 2004 receives, via the antenna 2002, a word that is based on a codeword of a polar code. Decoded bits are output at 2020 for further receiver processing.

In some embodiments, the apparatus 2000, and similarly the apparatus 1900 in FIG. 19 as noted above, include a non-transitory computer readable medium at 1912, 2012 that includes instructions for execution by a processor to implement and/or control operation of the encoder 1904, the sub-channel processing module 1910, and the rate matching module 1914 in FIG. 19, to implement and/or control operation of the decoder 2006, the sub-channel processing module 2010, and the de-rate matching module 2014 in FIG. 20, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1912, 2012.

The decoder 2006 is implemented in circuitry that is configured to decode received codewords. The sub-channel processing module 2010 is implemented in circuitry that is configured to select sub-channels as disclosed herein. Information representing the selected sub-channels could be provided to the decoder 2006 for use in decoding received words, and/or stored in the memory 2012 for subsequent use by the decoder.

The sub-channel processing module 2010 could be implemented in circuitry that is configured to select sub-channels as disclosed herein, and could be implemented using a processor. The same processor or other circuitry, or separate processors or circuitry, could be used to implement both the decoder 2006 and the sub-channel processing module 2010. In a processor-based implementation of the sub-channel processing module 2010, processor-executable instructions to configure a processor to perform sub-channel processing operations are stored in a non-transitory processor-readable medium, in the memory 2012 for example.

Like the decoder 2006 and the sub-channel processing module 2010, the de-rate matching module 2014 is implemented in circuitry, such as a processor, that is configured to perform receiver/decoder-side rate matching operations, also referred to as de-rate matching operations. These de-rate matching operations could include de-puncturing/de-shortening to reverse puncturing/shortening that was applied at an encoder/transmitter side, for example. In a processor-based implementation of the de-rate matching module 2014, processor-executable instructions to configure a processor to perform de-rate matching operations are stored in a non-transitory processor-readable medium, examples of which are described above. In an embodiment, information indicative of bit positions and/or sub-channels that are affected by rate matching, or information from which such bit positions or sub-channels may be determined, may be fed back to the sub-channel processing module 2010, stored to the memory 2012, or otherwise made available to the sub-channel processing module 2010 by the de-rate matching module 2014. This enables the sub-channel processing module 2010 to determine the bit positions or sub-channels that are affected by receiver/decoder-side rate matching.

In some embodiments, the functionality of the receiver 2004, the decoder 2006, the sub-channel processing module 2010, and/or the de-rate matching module 2014 described herein may be fully or partially implemented in software or modules, for example in receiving and decoding modules stored in the memory 2012 and executed by one or more processors of the apparatus 2000.

An apparatus could therefore include a processor, and a memory such as the memory 2012, coupled to the processor, storing instructions which, when executed by the processor, cause the processor to perform a method as disclosed herein, or receiving/decoding operations corresponding to transmitting/encoding operations disclosed herein. In the embodiment shown in FIG. 20, the apparatus 2000 includes the memory 2012, and the sub-channel processing module 2010, which is coupled to the memory 2012, could be configured to perform operations in accordance with embodiments disclosed herein.

The apparatus 2000 could implement any of various other features that are disclosed herein. For example, the decoder 2006, the receiver 2004, the sub-channel processing module 2010, and/or the de-rate matching module 2014 could be configured to implement any one or more of the features described herein, or receiving/decoding features corresponding to encoding/transmitting features described herein.

Communication equipment could include the apparatus 1900, the apparatus 2000, or both a transmitter and a receiver and both an encoder and a decoder. Such communication equipment could be user equipment or communication network equipment.

Figure 21:
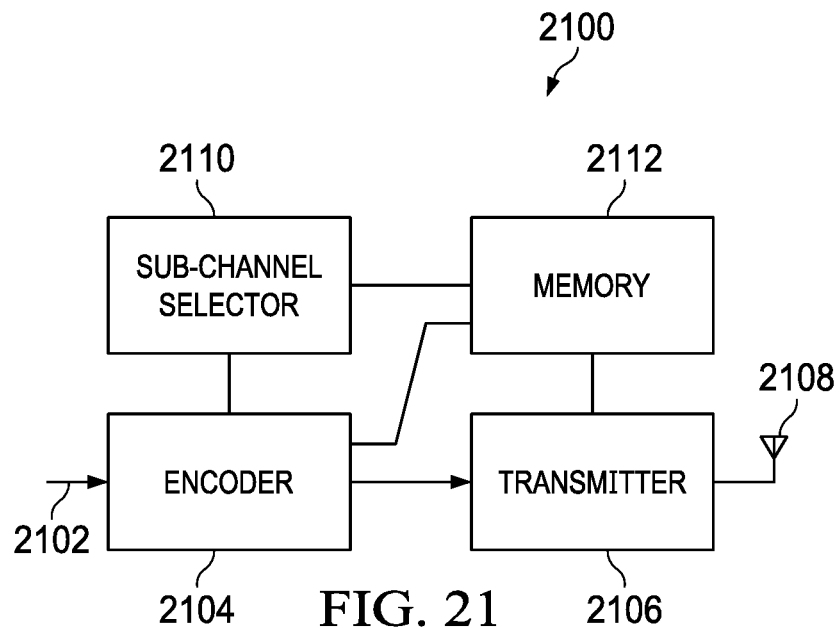
FIG. 21 is a block diagram of another apparatus for encoding and transmitting codewords.

FIG. 21 is a block diagram of another example apparatus for encoding and transmitting codewords. The apparatus 2100 includes an encoder 2104 coupled to a transmitter 2106. The apparatus 2100 also includes a sub-channel selector 2110 coupled to the encoder 2104. In the illustrated embodiment, the apparatus 2100 also includes an antenna 2108, coupled to the transmitter 2106, for transmitting signals over a wireless channel. In some embodiments, the transmitter 2106 includes a modulator, an amplifier, and/or other components of an RF transmit chain. A memory 2112 is also shown in FIG. 21, coupled to the encoder 2104, to the sub-channel selector 2110, and to the transmitter 2106.

The encoder 2104 is implemented in circuitry, such as a processor, that is configured to encode input bits as disclosed herein. In a processor-based implementation of the encoder 2104, processor-executable instructions to configure a processor to perform encoding operations are stored in a non-transitory processor-readable medium. The non-transitory medium could include, in the memory 2112 for example, one or more solid-state memory devices and/or memory devices with movable and possibly removable storage media.

The sub-channel selector 2110 is implemented in circuitry that is configured to select sub-channels as disclosed herein, and could be implemented using a processor. The same processor or other circuitry, or separate processors or circuitry, could be used to implement both the encoder 2104 and the sub-channel selector 2110. As noted above for the encoder 2104, in a processor-based implementation of the sub-channel selector 2110, processor-executable instructions to configure a processor to perform encoding operations are stored in a non-transitory processor-readable medium, in the memory 2112 for example.

The encoder 2104 is configured to encode, onto a number K of N sub-channels that are defined by a code and that have associated reliabilities for input bits at N input bit positions, input bits that are to be encoded. The sub-channel selector 2110 is configured to select fewer than K most reliable sub-channels of the N sub-channels based on a partial order of the N sub-channels in which reliabilities of at least some of N sub-channels relative to each other are independent of a transmission model, and to select a number of sub-channels from next most reliable sub-channels of the N sub-channels in the partial order, based on a transmission model dependent function. The selected most reliable sub-channels and the selected next most reliable sub-channels include K sub-channels to carry the bits that are to be encoded. Information representing the selected sub-channels could be provided to the encoder 2104 for use in encoding input bits, and/or stored in the memory 2112 for subsequent use by the encoder 2104.

The apparatus 2100 could implement any of various other features that are disclosed herein. For example, any one or more of the following could be provided, alone or in any of various combinations, in embodiments:

a total number of the most reliable sub-channels and the next most reliable sub-channels is greater than K;

the sub-channel selector is configured to select a number of sub-channels from the next most reliable sub-channels by selecting the number of sub-channels according to an order of the next most reliable sub-channels that is based on the transmission model dependent function;

the next most reliable sub-channels comprise a boundary subset in the partial order, above which a total number of sub-channels in the partial order is less than K and with a total number of sub-channels in the boundary subset and above the boundary subset in the partial order being greater than K (a boundary subset is an example of next most reliable sub-channels and a localization area as referenced herein, and FIGS. 13, 14, 16, and 17 illustrate examples of how a boundary subset could be determined or delineated—in other embodiments a boundary subset could be defined in some other manner than based on groups in the partial order);

the sub-channel selector is configured to determine the order of the sub-channels in the boundary subset based on the transmission model dependent function;

the sub-channel selector is configured to identify the sub-channels in the first subset and the second subset based on a binary expansion $(i_n, \ldots, i_1)$ of sub-channel indices i and a condition $$\left\{(i_n, \ldots, i_1) \middle| \left(\sum_{j=1}^{n} i_j \cdot j\right) = l\right\},$$

where $i_j \in \{0,1\}$, where l is an index of each of one or more groups of sub-channels in the boundary subset;

the sub-channel selector is configured to determine the order by comparing metrics associated with the next most reliable sub-channels based on the partial order;

$N=2^n$;

the transmission model dependent function is a function of SNR, an index of the sub-channel, and n;

the transmission model dependent function yields no conflict with the partial order and sufficient resolution to order the sub-channels in the identified region;

the transmission model dependent function comprises, for each sub-channel of index i, $$\text{metric} = \sum_{j=1}^{n} i_j \beta^{j-1},$$

where the index i has a binary expansion $(i_n, \ldots, i_1)$, $\beta = g(SNR, n)$, and $|\beta| > 1$;

the N sub-channels include sub-channels corresponding to bit positions that are frozen due to puncturing or shortening;

the sub-channel selector is configured to select sub-channels corresponding to bit positions that are not frozen due to puncturing or shortening;

K is a number of information bit positions that are to be encoded, and N−K is a number of frozen bit positions;

the transmitter transmits codewords generated by the encoder in encoding the bits that are to be encoded onto the K selected sub-channels.

In some embodiments, the functionality of the encoder 2104, the transmitter 2106, and/or the sub-channel selector 2110 described herein may be fully or partially implemented in software or modules, for example in encoding and transmitting modules stored in a memory such as the memory 2112 and executed by one or more processors of the apparatus 2100.

Figure 22:
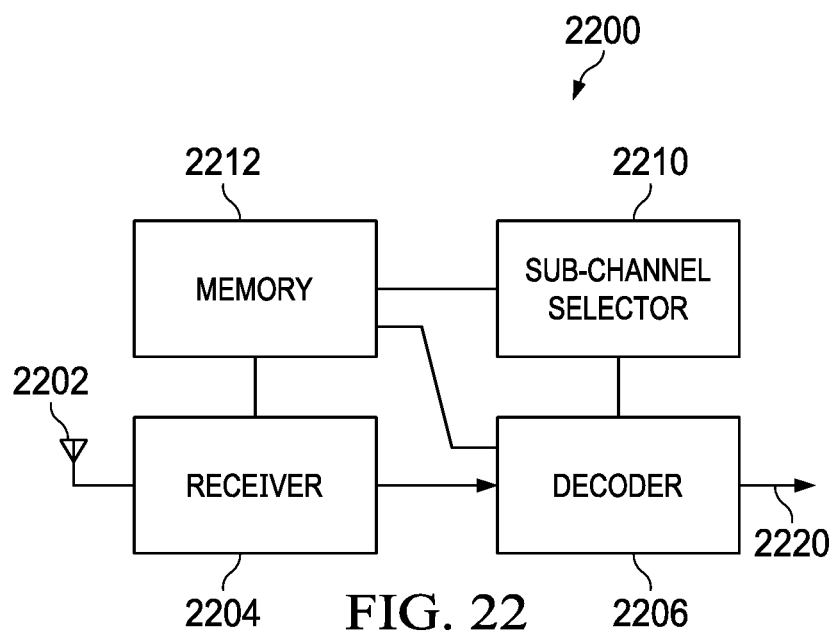
FIG. 22 is-a block diagram of another apparatus for receiving and decoding codewords.

FIG. 22 is a block diagram of another example apparatus for receiving and decoding codewords. The apparatus 2200 includes a receiver 2204 coupled to an antenna 2202 for receiving signals from a wireless channel, and to a decoder 2206. The apparatus 2200 also includes a sub-channel selector 2210 coupled to the decoder 2206. A memory 2212 is also shown in FIG. 22, coupled to the decoder 2206, to the sub-channel selector 2210, and to the receiver 2204.

In some embodiments, the receiver 2204 includes a demodulator, an amplifier, and/or other components of an RF receive chain. The receiver 2204 receives, via the antenna 2202, a word that is based on a codeword of a polar code. Decoded bits are output at 2220 for further receiver processing.

In some embodiments, the apparatus 2200, and similarly the apparatus 2100 in FIG. 21 as noted above, include a non-transitory computer readable medium at 2112, 2212 that includes instructions for execution by a processor to implement and/or control operation of the encoder 2104 and the sub-channel selector 2110 in FIG. 21, to implement and/or control operation of the decoder 2206 and the sub-channel selector 2210 in FIG. 22, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, a USB flash disk, or a removable hard disk, at 2112, 2212.

The decoder 2206 is implemented in circuitry that is configured to decode received codewords. The sub-channel selector 2210 is implemented in circuitry that is configured to select sub-channels as disclosed herein. Information representing the selected sub-channels could be provided to the decoder 2206 for use in decoding received words, and/or stored in the memory 2212 for subsequent use by the decoder 2206.

In some embodiments, the functionality of the receiver 2204, the decoder 2206, and/or the sub-channel selector 2210 described herein may be fully or partially implemented in software or modules, for example in receiving and decoding modules stored in the memory 2212 and executed by one or more processors of the apparatus 2200.

Communication equipment could include the apparatus 2100, the apparatus 2200, or both a transmitter and a receiver and both an encoder and a decoder. Such communication equipment could be user equipment or communication network equipment.

Figure 23:
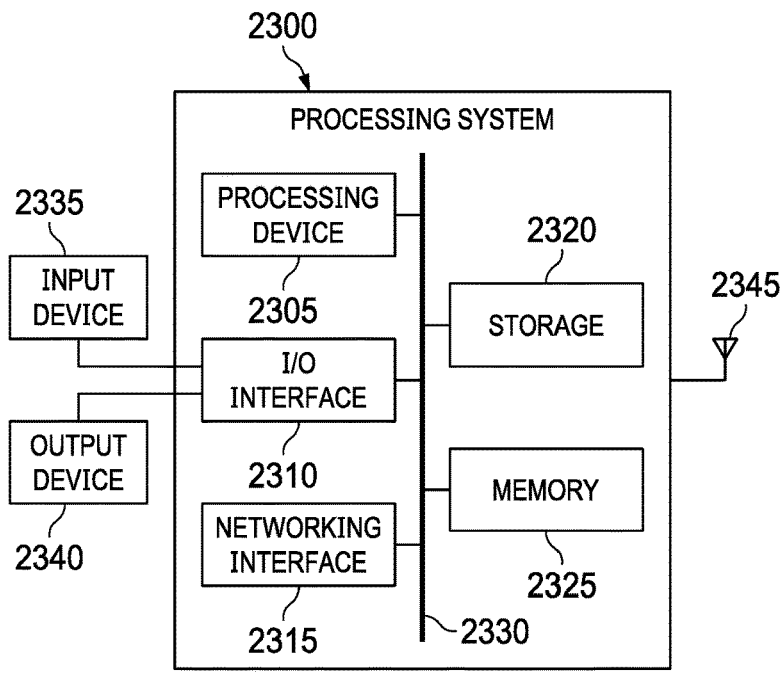
FIG. 23 is a block diagram of an example processing system, which may be used to implement embodiments disclosed herein.

FIGS. 19 to 22 are generalized block diagrams of apparatus that could be used to implement embodiments disclosed herein. FIG. 23 is a block diagram of an example processing system 2300, and provides a higher level implementation example. Any or all of the apparatus 1900, the apparatus 2000, the apparatus 2100, or the apparatus 2200 may be implemented using the example processing system 2300, or variations of the processing system 2300. The processing system 2300 could be a server or a mobile device, for example, or any suitable processing system. Other processing systems suitable for implementing embodiments described in the present disclosure may be used, which may include components different from those discussed below. Although FIG. 23 shows a single instance of each component, there may be multiple instances of each component in the processing system 2300.

The processing system 2300 may include one or more processing devices 2305, such as a processor, a microprocessor, an application-specific integrated circuit (ASIC), a field-programmable gate array (FPGA), dedicated logic circuitry, or combinations thereof. The processing system 2300 may also include one or more input/output (I/O) interfaces 2310, which may enable interfacing with one or more appropriate input devices 2335 and/or output devices 2340. The processing system 2300 may include one or more network interfaces 2315 for wired or wireless communication with a network (e.g., an intranet, the Internet, a peer-to-peer (P2P) network, a wide area network (WAN) and/or a local area network (LAN)) or other node. The network interfaces 2315 may include wired links (e.g., Ethernet cable) and/or wireless links (e.g., one or more antennas) for intra-network and/or inter-network communications. The network interfaces 2315 may provide wireless communication via one or more transmitters or transmit antennas and one or more receivers or receive antennas, for example. In this example, a single antenna 2345 is shown, which may serve as both transmitter and receiver. However, in other examples there may be separate antennas for transmitting and receiving. The processing system 2300 may also include one or more storage units 2320, which may include a mass storage unit such as a solid state drive, a hard disk drive, a magnetic disk drive and/or an optical disk drive.

The processing system 2300 may include one or more memories 2325, which may include a volatile or non-volatile memory (e.g., a flash memory, a random access memory (RAM), and/or a read-only memory (ROM)). The non-transitory memories 2325 may store instructions for execution by the processing devices 2305, such as to carry out examples described in the present disclosure. The memories 2325 may include other software instructions, such as for implementing an operating system and other applications/functions. In some examples, one or more data sets and/or modules may be provided by an external memory (e.g., an external drive in wired or wireless communication with the processing system 2300) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 2330 providing communication among components of the processing system 2300. The bus 2330 may be any suitable bus architecture including, for example, a memory bus, a peripheral bus, or a video bus. In FIG. 23, the input devices 2335 (e.g., a keyboard, a mouse, a microphone, a touchscreen, and/or a keypad) and output devices 2340 (e.g., a display, a speaker, and/or a printer) are shown as external to the processing system 2300. In other examples, one or more of the input devices 2335 and/or the output devices 2340 may be included as a component of the processing system 2300.

Figure 24:
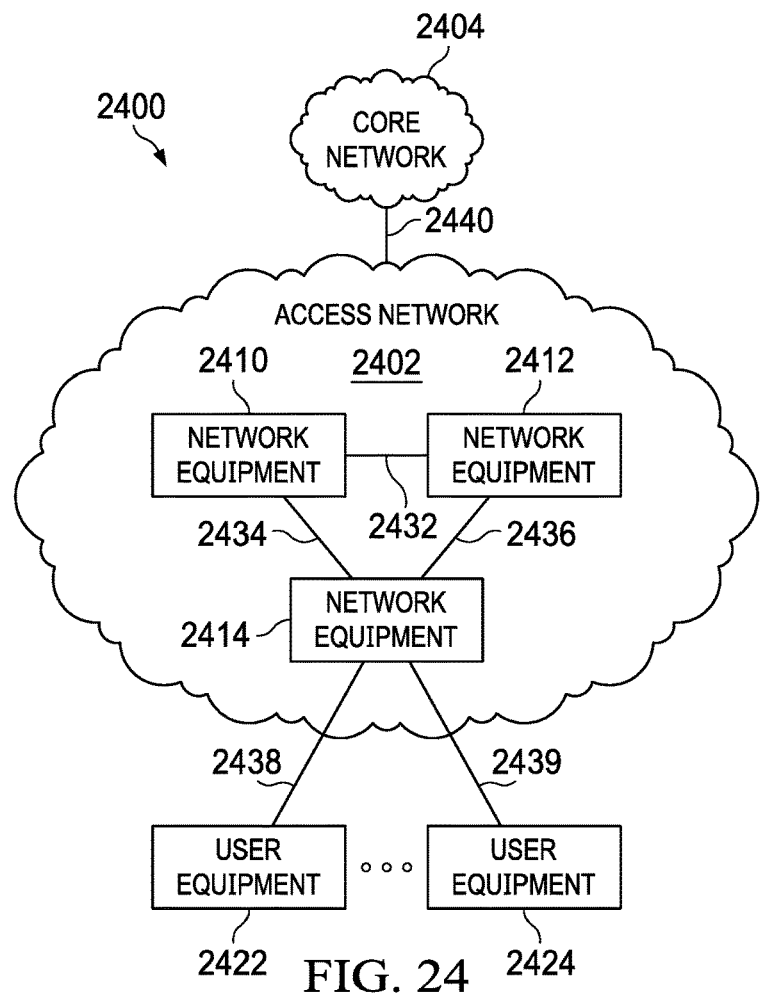
FIG. 24 is a block diagram of an example communication system.

FIG. 24 is a block diagram of an example communication system in which embodiments of the present disclosure could be implemented. The example communication system 2400 in FIG. 24 includes an access network 2402 and a core network 2404. The access network 2402 includes network equipment 2410, 2412, 2414 which communicate over network communication links 2432, 2434, 2436, and user equipment 2422, 2424 which communicate with network equipment 2414 in the example shown, over access communication links 2438, 2439. The access network 2402 communicates with the core network 2404 over another network communication link 2440. The core network 2404, like the access network 2402, may include network equipment that communicates with one or more installations of the network equipment 2410, 2412, 2414 in the access network 2402. However, in a communication system with an access network 2402 and a core network 2404, the core network 2404 might not itself directly provide communication service to user equipment.

The communication system 2400 is intended solely as an illustrative example. An access network 2402 could include more or fewer than three installations of network equipment, for example, which might or might not all directly communicate with each other as shown. Also, more than one installation of network equipment in the access network 2402 could provide communication service to user equipment. There could be more than one access network 2402 coupled to a core network 2404. It should also be appreciated that the present disclosure is not in any way limited to communication systems having an access network/core network structure.

Considering the access network 2402, any of various implementations are possible. The exact structure of network equipment 2410, 2412, 2414, and user equipment 2422, 2424 for which such network equipment provides communication service, is implementation-dependent. The apparatus 1900, 2000, 2100, 2200, 2300 in FIGS. 19 to 23 are examples of communication equipment that could be implemented at user equipment 2422, 2424 and/or network equipment 2410, 2412, 2414.

At least the network equipment 2414 that provides communication service to the user equipment 2422, 2424 includes a physical interface and communications circuitry to support access-side communications with the user equipment 2422, 2424 over the access links 2438, 2439. The access-side physical interface could be in the form of an antenna or an antenna array, for example, where the access communication links 2438, 2439 are wireless links. In the case of wired access communication links 2438, 2439, an access-side physical interface could be a port or a connector to a wired communication medium. Multiple access-side interfaces could be provided at the network equipment 2414 to support multiple access communication links 2438, 2439 of the same type or different types, for instance. The type of communications circuitry coupled to the access-side physical interface or interfaces at the access network equipment 2414 is dependent upon the type or types of access communication links 2438, 2439 and the communication protocol or protocols used to communicate with the user equipment 2422, 2424.

The network equipment 2410, 2412, 2414 also includes a network-side physical interface, or possibly multiple network-side physical interfaces, and communications circuitry to enable communications with other network equipment in the access network 2402. At least some installations of network equipment 2410, 2412, 2414 also include one or more network-side physical interfaces and communications circuitry to enable communications with core network equipment over the communication link 2440. There could be multiple communication links between network equipment 2410, 2412, 2414 and the core network 2404. Network-side communication links 2432, 2434, 2436 in the access network 2402, and the communication link 2440 to the core network 2404, could be the same type of communication link. In this case, the same type of physical interface and the same communications circuitry at the network equipment 2410, 2412, 2414 could support communications between access network equipment within the access network 2402 and between the access network 2402 and the core network 2404. Different physical interfaces and communications circuitry could instead be provided at the network equipment 2410, 2412, 2414 for communications within the access network 2402 and between the access network 2402 and the core network 2404.

Network equipment in the core network 2404 could be similar in structure to the network equipment 2410, 2412, 2414. However, as noted above, network equipment in the core network 2404 might not directly provide communication service to user equipment and therefore might not include access-side physical interfaces for access communication links or associated access-side communications circuitry. Physical interfaces and communications circuitry at network equipment in the core network 2404 could support the same type or types of network communication link or links as in the access network 2402, different type or types of network communication link or links, or both.

Just as the exact structure of the physical interfaces at network equipment 2410, 2412, 2414 and network equipment in the core network 2404 is implementation-dependent, the associated communications circuitry is implementation-dependent as well. In general, hardware, firmware, components which execute software, or some combination thereof, might be used in implementing such communications circuitry. Examples of electronic devices that might be suitable for implementing communications circuitry are provided above.

Each installation of user equipment 2422, 2424 includes a physical interface and communications circuitry compatible with an access-side physical interface and communications circuitry at the network equipment 2414, to enable the user equipment 2422, 2424 to communicate with the network equipment. Multiple physical interfaces of the same type or different types could be provided at the user equipment 2422, 2424. The user equipment 2422, 2424 could also include such components as input/output devices through which functions of the user equipment 2422, 2424 are made available to a user. In the case of a wireless communication device such as a smartphone, for example, these functions could include not only communication functions, but other local functions which need not involve communications. Different types of user equipment 2422, 2424, such as different smartphones for instance, could be serviced by the same network equipment 2414.

Any of the communication links 2432, 2434, 2436, 2438, 2439, 2440, and communication links in the core network 2404 could potentially be or include wireless communication links. Such communication links tend to be used more often within an access network 2402 than in a core network 2404, although wireless communication links at the core network level are possible.

Various embodiments disclosed herein exploit features of polar codes that have been strictly proven, to localize sub-channel ordering, ranking, or sorting during sub-channel selection. This could reduce computational complexity and/or memory cost. A partial order is universal for any transmission channel. With larger N, the fraction of nodes that are to be ordered is reduced, which could significantly reduce complexity and/or memory cost when computing bit position/sub-channel reliabilities. Performance of coding according to the present disclosure could still be comparable to existing code construction methods.

Embodiments may also be adaptable to any of various rate matching methods, block lengths, coding rates, SNRs, and/or other coding parameters that could affect code design. Rate matching methods could include, for example, BIV shortening, block-based puncturing, block-based shortening, etc. Any of various sequence determination methods could also be used in conjunction with the disclosed embodiments, including DE/GA, PW, genie-aided, offline static, and online dynamic computation, for example.

The previous description of some embodiments is provided to enable any person skilled in the art to make or use an apparatus, method, or processor-readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as an example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as the new 5G NR. The techniques disclosed herein could be used not only for control data over a control channel (e.g., the Physical Downlink Control Channel (PDCCH)) but also or instead other types of data (e.g., user data) over any type of channel (e.g., a data channel).

Illustrative examples described herein refer to sub-channel sequences that are in increasing order of a reliability metric. In other embodiments, ordered sequences that are in decreasing reliability order could be used.

Similarly, sub-channel selection could identify less reliable sub-channels rather than more reliable sub-channels.

Regarding partial orders, some nodes in one group may have a fixed reliability relationship, but without an edge or arrow between them in a representation of the partial order. For example, for N=128, node 73 is always better than node 70, but the binary index for node 70 cannot be transformed into the binary index for node 73 with just one of the operations noted above, and therefore there is no edge between nodes 70 and 73.

What is claimed is:

1. A method comprising:
   determining, by a communication network equipment, from N sub-channels that are defined by a polar code and that have associated reliabilities for input bits at N input bit positions, a number K of the N sub-channels to carry information bits that are to be encoded;
   determining, by the communication network equipment, ordering information about the N sub-channels, the ordering information including fully ordered information about a fully ordered subset of the N sub-channels associated with fully ordered highest associated reliabilities, the ordering information further including partially ordered information about a partially ordered area, sub-channels of the partially ordered area are associated with reliabilities in a partial order and lower than the fully ordered subset of the N sub-channels;
   determining, by the communication network equipment, based on one or more coding parameters, a localization area in the partially ordered area, wherein the localization area includes a first plurality of sub-channels of the N sub-channels;
   selecting, by the communication network equipment, a second plurality of sub-channels in the partially ordered area, the second plurality of sub-channels associated with reliabilities higher than the first plurality of sub-channels and lower than the fully ordered subset of the N sub-channels;
   fully ordering, by the communication network equipment, the first plurality of sub-channels in the localization area without fully ordering the second plurality of sub-channels in the partially ordered area;
   selecting, by the communication network equipment, a number of sub-channels from the first plurality of sub-channels in the localization area based on the fully ordering, wherein the selected second plurality of sub-channels in the partially ordered area, the number of sub-channels selected from the first plurality of sub-channels in the localization area, and the fully ordered subset of the N sub-channels comprise K sub-channels to carry the information bits that are to be encoded;
   encoding, by the communication network equipment, onto the K sub-channels, the information bits to generate codewords; and
   transmitting, by the communication network equipment, the codewords to a receiving apparatus over a wireless channel.

2. The method of claim 1, wherein the one or more coding parameters comprise one or more of: code rate, mother code block length N, code block length M, information block length K, rate matching scheme, or Signal to Noise Ratio (SNR).

3. The method of claim 1, wherein the partial order comprises a plurality of groups of sub-channels comprising respective subsets of the N sub-channels, the method further comprising:
determining a group of the plurality of groups to which a Kth sub-channel from a highest end of the partial order belongs; and
determining the localization area as a number of groups adjacent to and including the group to which the Kth sub-channel from the highest end of the partial order belongs.

4. The method of claim 3, wherein determining the localization area comprises determining a first number of adjacent groups in the partial order above the group to which the Kth sub-channel from the highest end of the partial order belongs and a second number of adjacent groups in the partial order below the group to which the Kth sub-channel from the highest end of the partial order belongs.

5. The method of claim 3, wherein determining the group to which the Kth sub-channel from the highest end of the partial order belongs comprises determining an i-th group of the plurality of groups, for which Group_Sum[i+1] <K<=Group_Sum[i], where Group_Sum[i] represents a total number of sub-channels in group i to group L−1 ($0 \le i \le L-1$), and L is a total number of groups including all of the N sub-channels.

6. The method of claim 1, wherein determining the localization area comprises determining the localization area as the number of sub-channels adjacent to and including a Kth sub-channel from a highest end of the partial order.

7. The method of claim 6, wherein determining the localization area comprises determining a first number of adjacent nodes in the partial order above the Kth sub-channel from the highest end of the partial order and a second number of adjacent nodes in the partial order below the Kth sub-channel from the highest end of the partial order.

8. The method of claim 1, wherein selecting the number of sub-channels from the first plurality of sub-channels in the localization area comprises selecting the number of sub-channels according to an order of the first plurality of sub-channels in the localization area.

9. The method of claim 8, wherein the order is determined based on one or more metrics associated with the first plurality of sub-channels.

10. The method of claim 1, wherein the N sub-channels comprise sub-channels corresponding to bit positions to be frozen due to puncturing or shortening, and wherein the selecting the number of sub-channels comprises:
selecting sub-channels corresponding to bit positions that are not frozen due to puncturing or shortening.

11. The method of claim 1, further comprising:
determining a second localization area for selection of sub-channels to carry further information bits that are to be encoded.

12. The method of claim 11, wherein the second localization area includes a different number of the N sub-channels than the localization area.

13. The method of claim 11, wherein the second localization area is determined responsive to a change in a coding parameter of the one or more coding parameters.

14. A communication network equipment comprising:
an encoder to:
encode, onto a number K of N sub-channels that are defined by a polar code and that have associated reliabilities for input bits at N input bit positions, information bits that are to be encoded to generate codewords;
a sub-channel processing module to:
determine ordering information about the N sub-channels, the ordering information including fully ordered information about a fully ordered subset of the N sub-channels associated with fully ordered highest associated reliabilities, the ordering information further including partially ordered information about a partially ordered area, sub-channels of the partially ordered area are associated with reliabilities in a partial order and lower than the fully ordered subset of the N sub-channels;
determine, based on one or more coding parameters, a localization area in the partially ordered area, wherein the localization area includes a first plurality of sub-channels of the N sub-channels;
select a second plurality of sub-channels in the partially ordered area, the second plurality of sub-channels associated with reliabilities higher than the first plurality of sub-channels and lower than the fully ordered subset of the N sub-channels;
fully order the first plurality of sub-channels in the localization area without fully ordering the second plurality of sub-channels in the partially ordered area; and
select a number of sub-channels from the first plurality of sub-channels in the localization area based on fully ordering of the first plurality of sub-channels, wherein the selected second plurality of sub-channels in the partially ordered area, the number of sub-channels selected from the first plurality of sub-channels in the localization area, and the fully ordered subset of the N sub-channels comprise K sub-channels to carry the information bits that are to be encoded; and
a transmitter, coupled to the encoder, to transmit the codewords to a receiving apparatus over a wireless channel.

15. The communication network equipment of claim 14, wherein the one or more coding parameters comprise one or more of: code rate, mother code block length N, code block length M, information block length K, rate matching scheme, or Signal to Noise Ratio (SNR).

16. The communication network equipment of claim 14, wherein the partial order comprises a plurality of groups of sub-channels comprising respective subsets of the N sub-channels, and
wherein the sub-channel processing module is further configured to determine a group of the plurality of groups to which a Kth sub-channel from a highest end of the partial order belongs, and to determine the localization area as a number of groups adjacent to and including the group to which the Kth sub-channel from the highest end of the partial order belongs.

17. The communication network equipment of claim 16, wherein the sub-channel processing module is configured to determine the localization area by determining a first number of adjacent groups in the partial order above the group to which the Kth sub-channel from the highest end of the partial order belongs and a second number of adjacent groups in the partial order below the group to which the Kth sub-channel from the highest end of the partial order belongs.

18. The communication network equipment of claim 16, wherein the sub-channel processing module is configured to determine the group to which the Kth sub-channel from the highest end of the partial order belongs by determining an i-th group of the plurality of groups, for which $\text{Group\_Sum}[i+1] < K \leq \text{Group\_Sum}[i]$, where $\text{Group\_Sum}[i]$ represents a total number of sub-channels in group i to group L−1 ($0 \leq i \leq L-1$), and L is a total number of groups including all of the N sub-channels.

19. The communication network equipment of claim 14, wherein the sub-channel processing module is configured to determine the localization area by determining the localization area as the number of sub-channels adjacent to and including a Kth sub-channel from a highest end of the partial order.

20. The communication network equipment of claim 19, wherein the sub-channel processing module is configured to determine the localization area by determining a first number of adjacent nodes in the partial order above the Kth sub-channel from the highest end of the partial order and a second number of adjacent nodes in the partial order below the Kth sub-channel from the highest end of the partial order.

21. The communication network equipment of claim 14, wherein the sub-channel processing module is configured to select the number of sub-channels from the first plurality of sub-channels in the localization area by selecting the number of sub-channels according to an order of the first plurality of sub-channels in the localization area.

22. The communication network equipment of claim 21, wherein the order is determined based on one or more metrics associated with the first plurality of sub-channels.

23. The communication network equipment of claim 14, wherein the N sub-channels comprise sub-channels corresponding to frozen bit positions due to puncturing or shortening, and wherein the sub-channel processing module is configured to select sub-channels corresponding to bit positions that are not frozen due to puncturing or shortening.

24. The communication network equipment of claim 14, wherein the sub-channel processing module is further configured to determine a second localization area for selection of sub-channels to carry further information bits that are to be encoded.

25. The communication network equipment of claim 24, wherein the second localization area includes a different number of the N sub-channels than the localization area.

26. The communication network equipment of claim 24, wherein the second localization area is determined responsive to a change in a coding parameter of the one or more coding parameters.

\* \* \* \* \*